United States Patent
Arishima et al.

(10) Patent No.: US 11,025,848 B2
(45) Date of Patent: Jun. 1, 2021

(54) PHOTOELECTRIC CONVERSION DEVICE, IMAGING SYSTEM, MOVING BODY, AND STACKABLE SEMICONDUCTOR DEVICE

(71) Applicant: CANON KABUSHIKI KAISHA, Tokyo (JP)

(72) Inventors: Yu Arishima, Yokohama (JP); Masahiro Kobayashi, Tokyo (JP); Koichiro Iwata, Kawasaki (JP); Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 102 days.

(21) Appl. No.: 16/551,111

(22) Filed: Aug. 26, 2019

(65) Prior Publication Data

US 2020/0075649 A1    Mar. 5, 2020

(30) Foreign Application Priority Data

Aug. 31, 2018   (JP) .............................. JP2018-163772
Jun. 14, 2019   (JP) .............................. JP2019-111594

(51) Int. Cl.
     *H04N 5/3745*      (2011.01)
     *H04N 5/355*      (2011.01)

(52) U.S. Cl.
     CPC ....... *H04N 5/37452* (2013.01); *H04N 5/3559* (2013.01); *H04N 5/3745* (2013.01); *B60R 2300/301* (2013.01); *B60R 2300/50* (2013.01)

(58) Field of Classification Search
None
See application file for complete search history.

(56) References Cited

U.S. PATENT DOCUMENTS

| | | | |
|---|---|---|---|
| 2018/0213205 A1* | 7/2018 | Oh .................... | H01L 27/14636 |
| 2019/0191109 A1* | 6/2019 | Mo ...................... | H04N 5/3452 |
| 2019/0230294 A1* | 7/2019 | Singh .................. | H04N 5/3559 |
| 2019/0238767 A1* | 8/2019 | Satou ................ | H01L 27/14636 |
| 2020/0396406 A1* | 12/2020 | Freson .................. | H04N 5/374 |
| 2021/0029316 A1* | 1/2021 | Lee .................... | H01L 27/14612 |

FOREIGN PATENT DOCUMENTS

| | | | |
|---|---|---|---|
| JP | 2006-148284 A | 6/2006 |
| JP | 2008-305983 A | 12/2008 |
| JP | 2010-124418 A | 6/2010 |
| JP | 2016-178408 A | 10/2016 |
| JP | 2017-534212 A | 11/2017 |

* cited by examiner

*Primary Examiner* — Cynthia Segura
(74) *Attorney, Agent, or Firm* — Canon U.S.A., Inc. IP Division

(57) ABSTRACT

A unit circuit includes a photoelectric conversion element, an output transistor including an input node and configured to output a signal based on a charge from the photoelectric conversion element, a reset transistor, and a first transistor connected to the input node and configured to change a capacitance of the input node. A first control signal supplied to a gate electrode of the first transistor has at least three types of voltages.

20 Claims, 18 Drawing Sheets

| OPERATION | Φ206 | Φ800 | Φ203 |
|---|---|---|---|
| E | VL | VL/VM4/VH | VL/VM3/VH |
| F | VM1 | VH | VH |
| G | VH | VL | VL/VM3/VH |
| H | VH | VM4 | VH |
| I | VH | VH | VL |
| J | VH | VH | VM3 |
| K | VH | VH | VH |

FIG.1
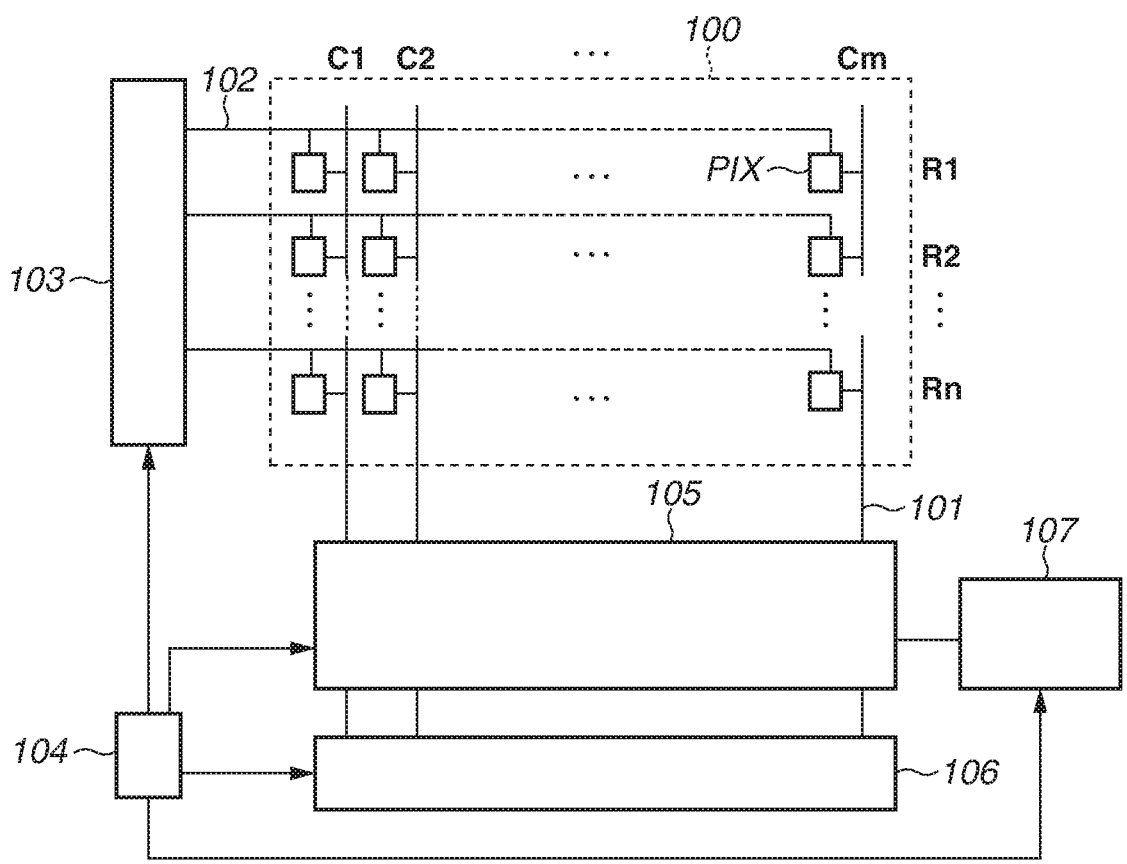
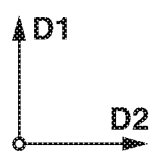

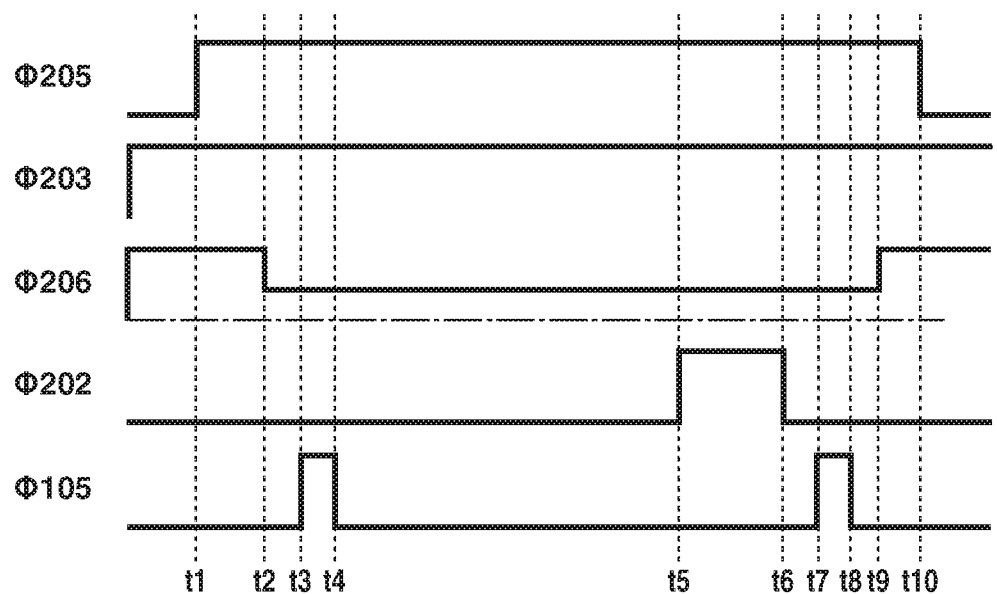

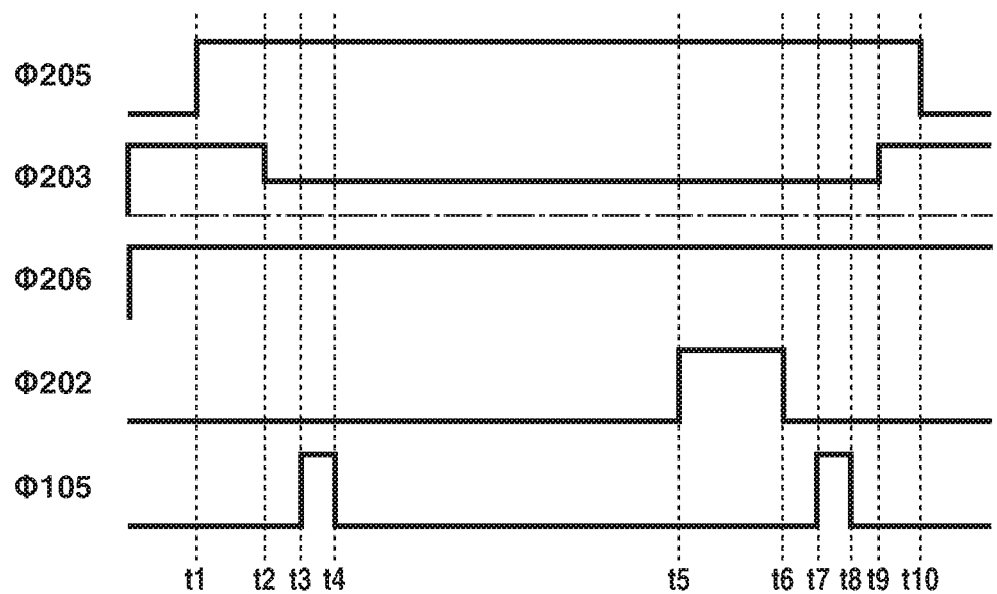

| OPERATION | Φ206 | Φ800 | Φ203 |
|---|---|---|---|
| E | VL | VL/VM4/VH | VL/VM3/VH |
| F | VM1 | VH | VH |
| G | VH | VL | VL/VM3/VH |
| H | VH | VM4 | VH |
| I | VH | VH | VL |
| J | VH | VH | VM3 |
| K | VH | VH | VH |

FIG.11A
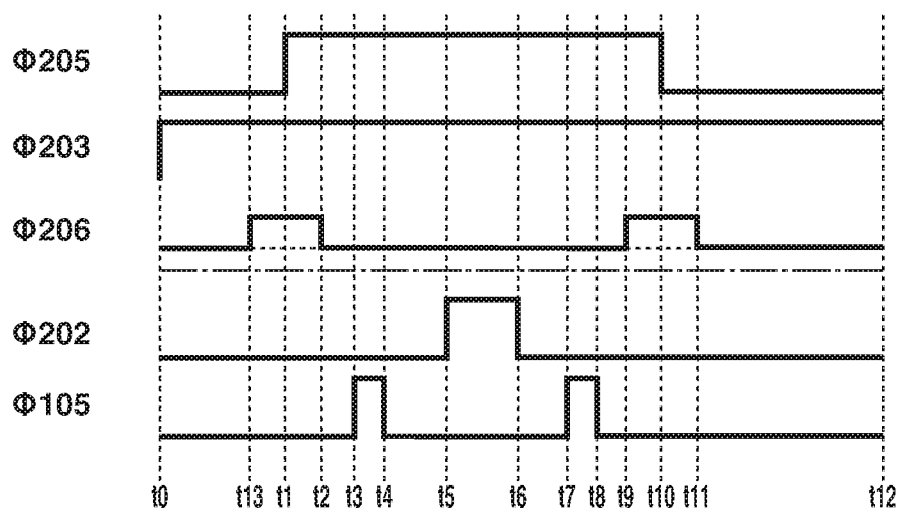
FIG.11B
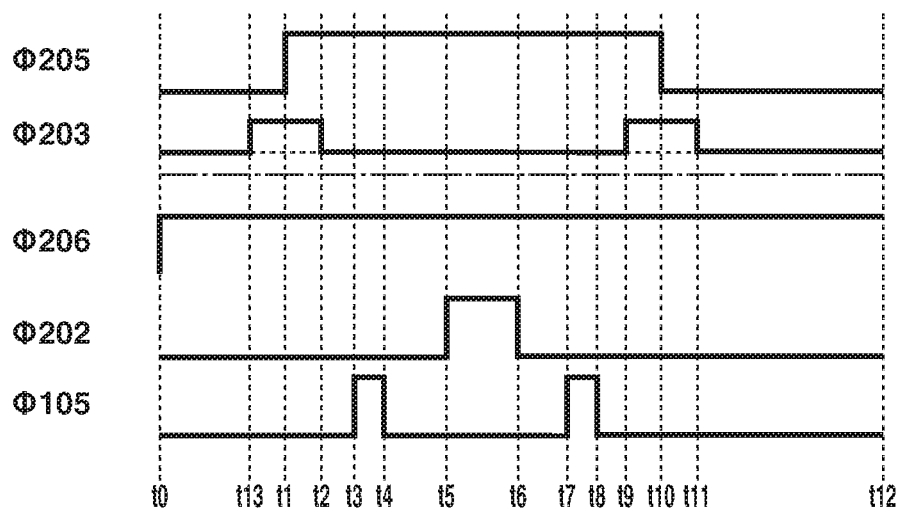
FIG.11C
TIMES t0 to t13 AND t11 to t12
| OPERATION | Φ206 | Φ203 |
|---|---|---|
| C" | VM1 | VH |
| D" | VH | VM2 |

FIG.16B
FRONT VIEW
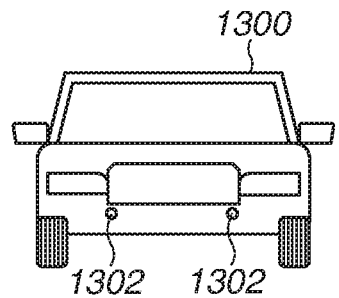
TOP VIEW
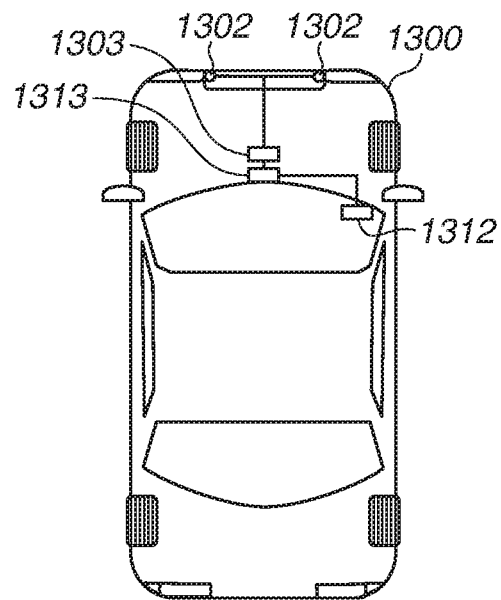
REAR VIEW
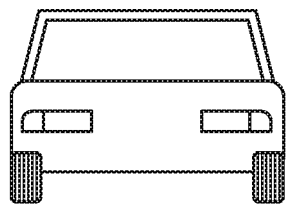

PHOTOELECTRIC CONVERSION DEVICE, IMAGING SYSTEM, MOVING BODY, AND STACKABLE SEMICONDUCTOR DEVICE

BACKGROUND

Field

One disclosed aspect of the embodiments relates to a photoelectric conversion device, an imaging system, a moving body, and a stackable semiconductor substrate.

Description of the Related Art

Japanese Patent Application Laid-Open No. 2010-124418 discusses an imaging device configured to include an additional capacitance transistor connected at an end to a floating diffusion (FD) portion and at the other end to a reset transistor for the sake of extended dynamic range.

SUMMARY

According to an aspect of the embodiments, a photoelectric conversion device includes a plurality of unit circuits each including a photoelectric conversion element, an output transistor, a reset transistor, and a first transistor. The output transistor includes an input node and is configured to output a signal based on a charge occurring in the photoelectric conversion element The reset transistor is configured to set a potential of the input node to a predetermined potential. The first transistor is connected to the input node and configured to switch a capacitance of the input node. The first control signal is supplied to a gate electrode of the first transistor has at least a first voltage at which the first transistor turns ON, a second voltage at which the first transistor turns OFF, and a third voltage having a value between values of the first and second voltages.

Further features of the disclosure will become apparent from the following description of exemplary embodiments with reference to the attached drawings.

BRIEF DESCRIPTION OF THE DRAWINGS

FIG. 1 is a block diagram for describing a photoelectric conversion device according to a first exemplary embodiment.

FIG. 4A is a timing chart for describing the first exemplary embodiment. FIG. 4B is a table for describing the first exemplary embodiment.

FIG. 5A is a timing chart for describing a second exemplary embodiment. FIG. 5B is a table for describing the second exemplary embodiment.

FIGS. 11A and 11B are timing charts for describing a sixth exemplary embodiment. FIG. 11C is a table for describing the sixth exemplary embodiment.

FIGS. 16A and 16B are diagrams illustrating a configuration of a moving body.

DESCRIPTION OF THE EMBODIMENTS

Figure 2:
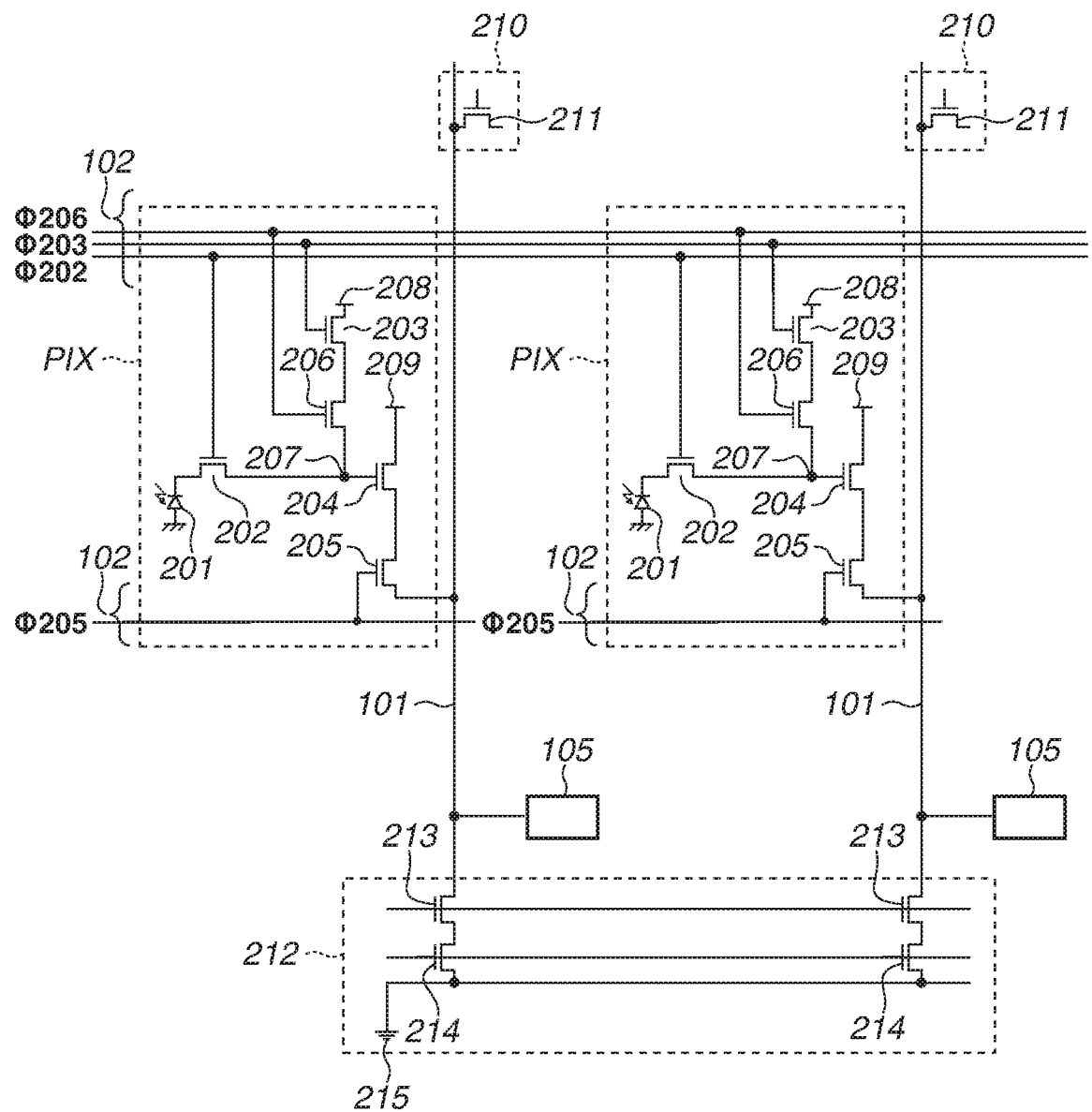
FIG. 2 is a schematic diagram for describing pixel circuits according to the first exemplary embodiment.

Exemplary embodiments will be described below with reference to the drawings. In the description of each exemplary embodiment, a description of similar components to those of the other exemplary embodiments may be omitted. In the following description, switches are N-type metal-oxide-semiconductor (MOS) transistors unless otherwise specified. A state where a switch is ON refers to the state in which a control signal of high level (H level) is input to the N-type MOS transistor and the N-type MOS transistor is conducting. A state where a switch is OFF refers to the state in which a control signal of low level (L level) is input to the N-type MOS transistor and the N-type MOS transistor is not conducting.

P-type MOS transistors may be used instead of N-type MOS transistors. In such a case, appropriate modifications can be made for application. Examples include reversing the potentials supplied to the P-type MOS transistors, such as a control signal, from those to the N-type MOS transistors. Complementary MOS (CMOS) switches including N-type and P-type MOS transistors in combination may be used with appropriate modifications. While connections between circuit elements are described in the description of the exemplary embodiments, modifications such as interposing other elements (switches and buffers) may be made as appropriate.

FIG. 1 is a block diagram of a photoelectric conversion device for describing a first exemplary embodiment. The photoelectric conversion device includes unit circuits that detect light and output a signal. The photoelectric conversion device according to the present exemplary embodiment is a photoelectric conversion device capable of imaging, and includes pixels as unit circuits. A pixel area 100 in FIG. 1 includes a plurality of pixels PIX. The plurality of pixels PIX is arranged in nth rows from R1 to Rn and mth columns from C1 to Cm. In FIG. 1, a first direction D1 indicates a column direction, and a second direction D2 a row direction. Aside from the pixels PIX that detect imaging signals, the pixel area 100 may include other pixels (not illustrated) such as optical black pixels that are shielded, dummy pixels that do not output a signal, and focus detection pixels. Vertical signal lines 101 are arranged on the respective pixel columns. The plurality of pixels PIX is connected to the vertical signal lines 101. The signals from the pixels PIX are output to the vertical signal lines 101. Control signal lines 102 are arranged on the respective pixel rows. Control signals for controlling operation of elements in the pixels PIX are supplied to the control signal lines 102. In FIG. 1, a control signal line 102 is provided for each pixel row. In fact, a plurality of control signal lines 102 is provided for each pixel row. A vertical scanning circuit unit 103 is a circuit for supplying the control signals for driving the elements in the pixels PIX to the pixels PIX via the control signal lines 102. The vertical scanning circuit 103 is connected with the control signal lines 102. The vertical scanning circuit unit 103 receives signals from a control circuit unit 104 and supplies the control signals to the pixel rows. The vertical signal lines 101 are input at one end to a column reading circuit unit 105. The column reading circuit unit 105 is a circuit that applies signal processing, such as amplification processing and analog-to-digital (AD) conversion processing, to pixel signal read from the pixels PIX. The column reading circuit unit 105 can include amplification units including buffers and differential amplification circuits, sample-and-hold circuits, and AD conversion circuits. A horizontal scanning circuit unit 106 is a circuit unit that supplies control signals to the column reading circuit unit 105. Based on the control signals from the horizontal scanning circuit unit 106, the pixel signals processed by the column reading circuit unit 105 are transferred to an output circuit unit 107. The output circuit unit 107 is a circuit for outputting the signals to a signal processing unit outside the photoelectric conversion device. The control circuit unit 104 is a circuit for controlling various circuits. Examples of the control circuit unit 104 include a timing generator. The control circuit unit 104 supplies control signals for controlling operation and timing of the vertical scanning circuit unit 103, the column reading circuit unit 105, the horizontal scanning circuit unit 106, and the output circuit unit 107. In one embodiment, some of the control signals to the vertical scanning circuit unit 103, the column reading circuit unit 105, the horizontal scanning circuit unit 106, and the output circuit unit 107 may be supplied from outside the photoelectric conversion device instead of the control circuit unit 104.

FIG. 2 is a schematic circuit diagram related to the pixels PIX of the photoelectric conversion device according to the present exemplary embodiment. FIG. 2 illustrates the columns C1 and C2 shown in FIG. 1 and represented by the signal lines 101. Only one pixel PIX is illustrated in each column, and the other pixels PIX are omitted. Similar components in the columns C1 and C2 are designated by the same reference numerals. A description thereof will be omitted.

In FIG. 2, a pixel PIX includes a photoelectric conversion element 201, a transfer transistor 202, a reset transistor 203, an amplification transistor 204, a selection transistor 205, and an additional capacitance transistor 206.

An example of the photoelectric conversion element 201 is a photodiode. Various configurations, such as a photoelectric conversion film of organic material and a photogate, may be applied. The transfer transistor 202 connects the photoelectric conversion element 201 and a floating diffusion (FD) portion 207 in a selective manner. The transfer transistor 202 transfers a charge occurring in the photoelectric conversion element 201 to the FD portion 207. The FD portion 207 is an input node of the amplification transistor 204. The amplification transistor 204 outputs a signal based on the potential of the FD portion 207 to the selection transistor 205. An end 209 of the amplification transistor 204 is connected to a power supply voltage, for example. The amplification transistor 204 is part of a source-follower circuit, with the gate electrode of the amplification transistor 204 as the input node. The selection transistor 205 connects the amplification transistor 204 and the vertical signal line 101 in a selective manner. The selection transistor 205 outputs the signal from the amplification transistor 204 to the vertical signal line 101 in synchronization with the timing of a control signal $\Phi 205$ from the vertical scanning circuit unit 103.

An end of the additional capacitance transistor 206 is connected to the FD portion 207. The other end of the additional capacitance transistor 206 is connected to an end of the reset transistor 203. The other end of the reset transistor 203 is connected to a power supply voltage 208, for example. In other words, the additional capacitance transistor 206 connects the reset transistor 203 and the FD portion 207 in a selective manner. It can be said that the additional capacitance transistor 206 and the reset transistor 203 is connected in series to the FD portion 207. The reset transistor 203 can set (reset) the FD portion 207 to a reset potential. The additional capacitance transistor 206 can switch, modify, or change the capacitance of the FD portion 207 by turning on and off itself.

The additional capacitance transistor 206 will now be described. The additional capacitance transistor 206 needs only to be at least connected at one end to the FD portion 207. If the additional capacitance transistor 206 turns ON, a capacitance (MOS capacitance) resulting from the channel formation of the additional capacitance transistor 206 is added to the capacitance of the FD portion 207. Capacitances related to the other end of the additional capacitance transistor 206, such as a capacitance between the gate electrode and the other end, a PN junction capacitance of the semiconductor region constituting the other end, and capacitances between the other end and surrounding wires, are further added to the capacitance of the FD portion 207. As the capacitance of the FD portion 207 increases, the charge that is held by the FD portion 207 increases, whereby the dynamic range can be extended. If the additional capacitance transistor 206 turns OFF, the foregoing capacitances related to the additional capacitance transistor 206 are not added to the FD portion 207, and the capacitance of the PD portion 207 is unchanged. In such a case, the amount of change of the FD portion 207 in voltage with respect to a single charge (charge-voltage conversion efficiency) can be increased. A high charge-voltage conversion efficiency translates into high sensitivity. The capacitance of the FD portion 207 (capacitance of the input node), or equivalently, the sensitivity can thus be switched by the additional capacitance transistor 206. The capacitance to be added when the additional capacitance transistor 206 turns ON can be determined as appropriate by transistor designs and layout with other wires.

Control signals are supplied to the gate electrodes of transistors in the pixel PIX. In FIG. 2, a control signal $\Phi 202$ is supplied to the gate electrode of the transfer transistor 202. A control signal $\Phi 203$ is supplied to the gate electrode of the reset transistor 203. A control signal $\Phi 206$ is supplied to the gate electrode of the additional capacitance transistor 206. The control signals $\Phi 202$, $\Phi 203$, and $\Phi 206$ are supplied from the horizontal scanning circuit unit 106 of FIG. 1 to the respective transistors 202, 203, and 206 via control signal lines 102. In FIG. 2, the control signal lines 102 are laid across a plurality of columns, and common control signals are supplied to a plurality of pixels PIX arranged in the same row.

A clipping circuit 210 is connected to each vertical signal line 101. The clipping circuit 210 can limit the amplitude of the signal (potential) on the vertical signal line 101. The clipping circuit 210 includes at least one transistor 211. An end of the transistor 211 is connected to the vertical signal line 101. A control signal is supplied to the gate electrode of the transistor 211. If the potential of the vertical signal line 101 exceeds a predetermined value or falls below a predetermined value, the clipping circuit 210 operates to maintain the potential of the vertical signal line 101 at a potential based on the control signal.

A constant current source 212 is connected to the vertical signal lines 101. The constant current source 212 includes two transistors 213 and 214 connected in series to each vertical signal line 101. An end of the transistor 213 is connected to the vertical signal line 101. The other end of the transistor 213 is connected to an end of the transistor 214. The other end of the transistor 214 is grounded (connected to a ground potential). The gate electrodes of the transistors 213 in the respective columns are connected in common. The gate electrodes of the transistors 214 in the respective columns are connected in common. The constant current source 212 may have a different configuration, such as without the transistors 213.

Figure 3A:
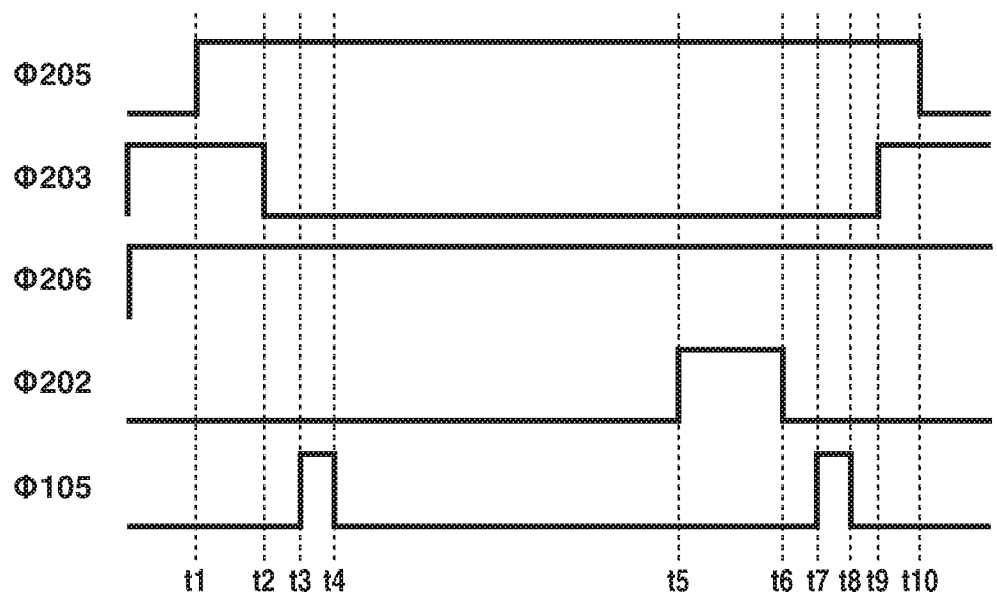
FIGS. 3A and 3B are timing charts for describing the first exemplary embodiment.
Figure 3B:
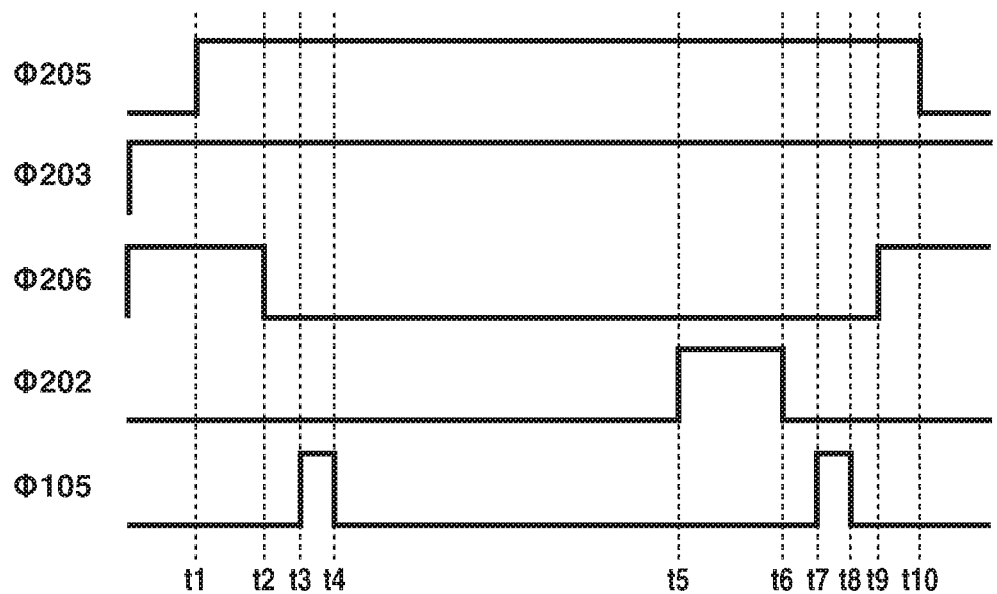

FIGS. 3A and 3B are timing charts illustrating the control signals of the transistors in a pixel PIX in FIG. 2. The horizontal axes of the timing charts indicate time. FIGS. 3A and 3B illustrate the states of the potentials of the control signals Φ205, Φ203, Φ206, and Φ202 illustrated in FIG. 2. A control signal Φ105 indicates the state of the potential of a control signal for storing signals from pixels PIX in the column reading circuit unit 105 of FIG. 1. The control signals each have an H-level voltage VH at which the transistors turn ON and an L-level voltage VL at which the transistors turn OFF. The voltages VH and VL have a relationship of VH>VL in magnitude. FIG. 3A illustrates a case where the additional capacitance transistor 206 is turned ON. FIG. 3B illustrates a case where the additional capacitance transistor 206 is turned OFF.

The case of FIG. 3A will initially be described. At time t1, the control signal Φ205 becomes the H level. The selection transistor 205 of the pixel PIX turns ON, and the pixel PIX enters a signal outputting state (selected state). The control signals Φ203 and Φ206 are at the H level. The control signal Φ206 remains at the H level from time t1 to time t10. The additional capacitance transistor 206 turns ON, and the reset transistor 203 turns ON. The FD portion 207 and the additional capacitance transistor 206 connected to the FD portion 207 both of which are in the ON state are set (reset) to a predetermined potential by the reset transistor 203.

At time t2, the control signal Φ203 becomes the L level. The reset transistor 203 turns OFF to complete resetting the FD portion 207. Meanwhile, the additional capacitance transistor 206 is in the ON state since the control signal Φ206 is maintained at the H level. Here, it can be said that the reset operation is controlled by the control signal Φ203. Since the additional capacitance transistor 206 turned ON is connected to the FD portion 207, the capacitance of the FD portion 207 is increased compared to when the additional capacitance transistor 206 is in an OFF state. At times t3 to t4, the control signal Φ105 becomes the H level, whereby the signal from the pixel PIX is stored into the column reading circuit unit 105 via the vertical signal line 101. The signal from the pixel PIX here is a signal based on the potential of the FD portion 207 when the FD portion 207 is reset (reset signal).

At times t5 to t6, the control signal Φ202 becomes the H level, whereby the charge of the photoelectric conversion element 201 is transferred to the FD portion 207. A signal based on the charge transferred to the FD portion 207 (detection signal) is output from the pixel PIX. At times t7 to t8, the control signal Φ105 becomes the H level, whereby the signal from the pixel PIX is stored into the column reading circuit unit 105. At time t9, the control signal Φ203 becomes the H level, whereby the additional capacitance transistor 206 and the FD portion 207 are reset. At time t10, the control signal Φ205 becomes the L level. This brings the pixel PIX into a non-selected state, and a series of read operations on the pixel PIX is completed. The detection signal is a signal based on light. For example, in the case of imaging, the detection signal can be referred to as an imaging signal.

During the read operations, the control signal Φ206 remains at the H level. The capacitance of the region including the channel formed under the gate of the additional capacitance transistor 206 is also added to the capacitance of the FD portion 207. This can increase the amount of charge that is held by the FD portion 207, whereby the dynamic range of the FD portion 207 can be extended.

Next, the case of FIG. 3B will be described. The control signal Φ206 has the voltages VH and VL, and the control signal Φ203 has the voltages VH and VL. At time t1, the control signal Φ205 becomes the H level. The selection transistor 205 of the pixel PIX turns ON, and the pixel PIX enters a signal-reading state (selected state). The control signals Φ203 and Φ206 are at the H level. The control signal Φ203 remains at the H level from time t1 to time t10. The additional capacitance transistor 206 turns ON, and the reset transistor 203 turns ON. The FD portion 207 and the additional capacitance transistor 206 connected to the PD portion 207 both of which are in the ON state are set (reset) to a predetermined potential by the reset transistor 203.

At time t2, the control signal Φ206 becomes the L level, whereby the additional capacitance transistor 206 is turned OFF. The reset transistor 203 and the FD portion 207 are disconnected, whereby the resetting of the FD portion 207 is completed. Since the control signal Φ203 is maintained at the H level, the reset transistor 203 remains on. That is, it can be said that the reset operation is controlled by the control signal Φ206. Since the additional capacitance transistor 206 turned off is connected to the FD portion 207, no capacitance is added to that of the FD portion 207. In other words, the capacitance of the FD portion 207 is reduced, compared to that of the FD portion 207 in FIG. 3A.

At times t3 to t4, the control signal Φ105 becomes the H level. The signal from the pixel PIX is thereby stored into the column reading circuit unit 105 via the vertical signal line 101. As in FIG. 3A, the signal from the pixel PIX here is output based on the potential of the FD portion 207 when the PD portion 207 is reset (reset signal). At times t5 to t6, the control signal Φ202 becomes the H level, whereby the charge of the photoelectric conversion element 201 is transferred to the FD portion 207. A signal based on the charge transferred to the FD portion 207 is output from the pixel PIX. At times t7 to t8, the control signal Φ105 becomes the H level, whereby the signal from the pixel PIX is stored into the column reading circuit unit 105. At time t9, the control signal Φ206 becomes the H level. The additional capacitance transistor 206 turns ON, and the FD portion 207 is reset. At time t10, the control signal Φ205 becomes the L level. This brings the pixel PIX into the non-selected state, and a series of read operations on the pixel PIX is completed.

During the reading operations, the control signal Φ203 remains at the H level, and the reset transistor 203 is thus constantly ON. The additional capacitance transistor 206 turns ON at the timing of the reset operation, whereby the PD portion 207 is reset. At times t2 to t9, the additional capacitance transistor 206 is off. The capacitance of the FD portion 207 is thus smaller than in FIG. 3A, and the read operations can be performed with the charge-voltage conversion efficiency of the FD portion 207 high. In other words, the change (amplitude) of the potential of the PD portion 207 due to the charge transferred by the transfer transistor 202 becomes large. This can improve sensitivity when the signal charge is small, such as in capturing an image of a dark object having low luminance.

The read operations of FIG. 3B can cause the following phenomenon in capturing an image of an object having low luminance. Suppose there is an object of high luminance in part of the imaging area. When a signal corresponding to the object of high luminance is read, the FD portion 207 can produce an unexpectedly large change in potential since the charge-voltage conversion efficiency of the PD portion 207 is high. The large change in potential can exceed the operation range of the read path of the signal subsequent to the FD portion 207. The read path refers specifically to the vertical signal line 101 and the column reading circuit unit 105. For example, the vertical signal line 101 reading the signal corresponding to the object of high luminance can affect the signals of other vertical signal lines 101 via the constant current source 212. In capturing an image of an object having low luminance, the signals are often amplified by the column reading circuit unit 105. Due to the signal amplification, the effect (noise) can also be amplified to cause a deterioration in image quality. As illustrated in FIG. 2, the vertical signal line 101 on the respective columns are provided with the clipping circuits 210 serving as amplitude limiting circuits for limiting variations in potential. However, the clipping circuits 210 are not sufficient to obtain an image of higher quality. The reason is that the resistances of the vertical signal lines 101 can also affect the image quality, depending on the distance from the clipping circuits 210.

In the present exemplary embodiment, the control signal Φ206 for driving the additional capacitance transistor 206 has at least three types of voltages. The three types of voltages include the H-level voltage VH at which the additional capacitance transistor 206 turns ON, the L-level voltage VL at which the additional capacitance transistor 206 turns OFF, and an M1-level voltage VM1 that is a voltage between the voltages VH and VL. The voltage VM1 is a voltage intended for the additional capacitance transistor 206 to operate as an amplitude limiting circuit for the PD portion 207. The voltages VH, VL, and VM1 have a relationship of VH>VM1>VL in magnitude.

A case where the additional capacitance transistor 206 is operated as an amplitude limiting circuit will be described with reference to FIG. 4A. FIG. 4A is a timing chart similar to FIGS. 3A and 3B. FIG. 4A is the same as FIG. 3B except the operation of the additional capacitance transistor 206 at times t2 to t9.

At time t1, the control signal Φ205 becomes the H level. The selection transistor 205 of the pixel PIX turns ON, and the pixel PIX enters the signal-reading state (selected state). The control signals Φ203 and Φ206 are at the H level. The control signal Φ203 remains at the H level from time t1 to time t10. The additional capacitance transistor 206 turns ON, and the reset transistor 203 turns ON. The FD portion 207 and the additional capacitance transistor 206 connected to the FD portion 207 both of which are in the ON state are set (reset) to a predetermined potential by the reset transistor 203.

At time t2, the control signal Φ206 becomes the M1 level. The additional capacitance transistor 206 is thereby turned OFF and, at the same time, starts to function as an amplitude limiting circuit. The reset transistor 203 and the PD portion 207 are disconnected, whereby the resetting of the FD portion 207 is completed. Since the control signal Φ203 is maintained at the H level, the reset transistor 203 remains ON. That is, it can be said that at time t2, the reset operation is controlled by the control signal Φ206. Since the additional capacitance transistor 206 is OFF, no capacitance is added to that of the FD portion 207. In a strict sense, a minute change in capacitance can occur, compared to when the control signal Φ206 is at the L level. The control signal Φ206 is desirably maintained in the same state during the period in which the signal is read twice.

At times t3 to t4, the control signal Φ105 becomes the H level, whereby the signal from the pixel PIX is stored into the column reading circuit unit 105 via the vertical signal line 101. This signal is output based on the potential of the FD portion 207 when the FD portion 207 is reset (reset signal). At times t5 to t6, the control signal Φ202 becomes the H level, whereby the charge of the photoelectric conversion element 201 is transferred to the FD portion 207. A signal based on the charge transferred to the FD portion 207 is then output from the pixel PIX. At times t7 to t8, the control signal Φ105 becomes the H level, whereby the signal from the pixel PIX is stored into the column reading circuit unit 105. At time t9, the control signal Φ206 becomes the H level. The additional capacitance transistor 206 turns on, and the FD portion 207 is reset. At time t10, the control signal Φ205 becomes the L level. This brings the pixel PIX into the non-selected state, and a series of read operations on the pixel PIX is completed.

At times t5 to t6, the charge of the photoelectric conversion element 201 is transferred to the FD portion 207, and the FD portion 207 changes in voltage. As with the operation of FIG. 3B, the FD portion 207 here is set to have a high charge-voltage conversion efficiency. If a large amount of charge corresponding to an object of high luminance is transferred to the FD portion 207, the voltage of the FD portion 207 is likely to drop by an amount corresponding to the charge. On the contrary, the additional capacitance transistor 206, which is operating as the amplitude limiting circuit, regulates the voltage of the FD portion 207 to a predetermined value (set voltage). For example, the voltage of the FD portion 207, which is high in the reset state, can fall below the set voltage of the additional capacitance transistor 206 because of a charge (electrons) from the photoelectric conversion element 201. In other words, the potential of the FD portion 207 can change greatly (have a large amplitude). On such occasions, the additional capacitance transistor 206 switches from OFF to ON and operates to maintain the voltage of the FD portion 207 at the set voltage. If the voltage of the FD portion 207 does not fall below the set voltage when the charge is transferred from the photoelectric conversion element 201, the additional capacitance transistor 206 makes no operation. In other words, if the voltage of the FD portion 207 falls to or below a certain value, the additional capacitance transistor 206 turns ON to discharge the charge to the supply wiring of the reset potential. Since the amplitude of the PD portion 207 is limited by such an operation, an excessive drop in the voltage of the FD portion 207 can be suppressed. Consequently, image information of higher quality can be obtained.

In the read operations of FIG. 4A, the control signals Φ206 and Φ203 have two voltages each. The control signal Φ206 has the voltages VH and VM1, and the control signal Φ203 has the voltages VH and VL. The voltage VH is a voltage at which the additional capacitance transistor 206 and the reset transistor 203 turn ON. The voltage VL is a voltage at which the reset transistor 203 turns OFF. The voltage VM1 is a voltage at which the additional capacitance transistor 206 turns OFF and can operate as an amplitude limiting circuit. In other words, the two transistors turn OFF at different voltages.

FIG. 4B is a table summarizing the operations of FIGS. 3A, 3B, and 4A. FIG. 4B illustrates a relationship between the control signals Φ206 and Φ203 in a signal-reading period. The signal-reading period refers to the period between times t2 and t9 in FIGS. 3A, 3B, and 4A, and in which the reset operation ends and the signal is stored into a circuit outside the pixel PIX. The relationship illustrated in FIG. 4B needs only to be satisfied between times t5 and t8 of FIGS. 3A, 3B, and 4A in particular, i.e., while a charge is transferred to the FD portion 207 and a signal based on the charge is read. The same operation as that between times t5 and t8 is desirably performed between times t2 and t4 of FIGS. 3A, 3B, and 4A where the reset signal is read. The reason is that the reset signal is desirably a signal under a condition as similar to when the signal based on the charge is read as possible.

Operation A corresponds to FIG. 3A and represents a case where the signal reading operation is performed with the capacitance of the FD portion 207 increased. The control signal Φ206 is at the voltage VH, and the control signal Φ203 is at the voltage VL. Operation B corresponds to FIG. 3B and represents a case where the signal reading operation is performed without increasing the capacitance of the FD portion 207. The control signal Φ206 is at the voltage VL. In FIG. 3B, the control signal Φ203 is at the voltage VH, whereas a similar operation can be made with the voltage VL. Operation C corresponds to FIG. 4A and represents a case where the signal reading operation is performed while the additional capacitance transistor 206 is turned OFF and operated as an amplitude limiting circuit, and the capacitance of the FD portion 207 is not increased. The control signal Φ206 is at the voltage VM1, and the control signal Φ203 is at the voltage VH.

The relationship between the operations illustrated in FIG. 4B and signal processing will be described. For example, a relationship between the operations illustrated in FIG. 4B and the gain of the amplification unit in the column reading circuit unit 105 can be defined as follows: If the amplification unit performs amplification processing with a high gain, the read operations are performed by using the control signals Φ206 and Φ203 illustrated as operation C. If the amplification unit performs amplification processing with a low gain, the read operations are performed by using the control signals Φ206 and Φ203 illustrated as operation A or B. Performing signal processing with such a relationship can provide high-quality image information without departing from the operation range of the read path.

For example, a relationship between the operations of FIG. 4B and the luminance of an object can be defined as follows: If the luminance of the object is high, the read operations are performed by using the control signals Φ206 and Φ203 illustrated as operation A. If the luminance of the object is low, the read operations are performed by using the control signals Φ206 and Φ203 illustrated as operation B or C. Performing signal processing with such a relationship enables signal acquisition with high sensitivity even if the luminance of the object is low. By operation C, high-quality image information without departing from the operation range of the read path can be obtained even if high-gain amplification processing is performed in subsequent signal processing.

The photoelectric conversion device according to the present exemplary embodiment can switch operations A to C by using signals from the control circuit unit 104 (FIG. 1). For example, the control circuit unit 104 monitors the luminance of an object and supplies a switching signal in response to a signal based on the monitoring result. Examples of an imaging system to be described below include a digital still camera. The gain can be set based on the setting of the International Organization for Standardization (ISO) speed of the digital still camera. In such a case, for example, the control circuit unit 104 can supply a gain setting signal corresponding to the set ISO speed and a control signal for selecting operation. The setting of the ISO speed can be arbitrarily made. The setting of the ISO speed can be made by feeding back luminance information as described above.

The configuration according to the present exemplary embodiment that the control signals Φ203 and Φ206 have different OFF voltages can suppress an excessive drop in the potential of the FD portion 207. Since the control signal Φ206 according to the present exemplary embodiment has at least three voltages, the capacitance related to the FD portion 207, i.e., the input node can be appropriately switched while suppressing an excessive drop in the potential of the input node.

The control signal Φ206 may have four levels, i.e., may further have an M2 level different from the other three. The M2 level has a value between those of the H level and the L level. The M2-level voltage VM2 satisfies VH>VM2>VL. If, for example, VM1<VM2, the control signal Φ206 can be switched from the M1 level to the M2 level depending on the gain setting of the amplification unit. Examples of the case where the additional capacitance transistor 206 operates at the M2 level include when the gain is higher than with the M1 level.

The amplitude of the vertical signal line 101 to be limited by the clipping circuit 210 can be set greater than that of the input node to be limited by the additional capacitance transistor 206.

A second exemplary embodiment is configured in such a manner that the control signal Φ203 of the reset transistor 203 has an M2 level between the H level and the L level, in addition to the configuration of the first exemplary embodiment. An operation when the control signal Φ203 has the M2 level will be described with reference to FIG. 5A. FIG. 5A is a timing chart similar to FIGS. 3A, 3B, and 4A. FIG. 5A is the same as FIG. 3A except the control signal Φ203. Specifically, at times t2 to t9, the control signal Φ203 is set at the M2 level instead of the L level. The M2 level refers to a voltage VM2, the voltage at which the reset transistor 203 turns off and can operate as an amplitude limiting circuit for the potential of the FD portion 207. By the operation illustrated in FIG. 5A, the additional capacitance transistor 206 is turned ON to increase the capacitance of the FD portion 207 to suppress an excessive drop in the potential of the FD portion 207.

FIG. 5B is a table similar to FIG. 4B. Operation D corresponds to FIG. 5A and represents a case where the signal reading operation is performed while the capacitance of the FD portion 207 is increased. The control signal Φ206 is at the voltage VH, and the control signal Φ203 the voltage VM2. The voltage VM2 and the voltages VH and VL of the reset transistor 203 satisfy the relationship of VH>VM2>VL. In the present exemplary embodiment, operation B of FIG. 4B can be represented as operation B' of FIG. 5B. Specifically, the control signal Φ203 may have any one of the values VH, VL, and VM2.

Figure 6A:
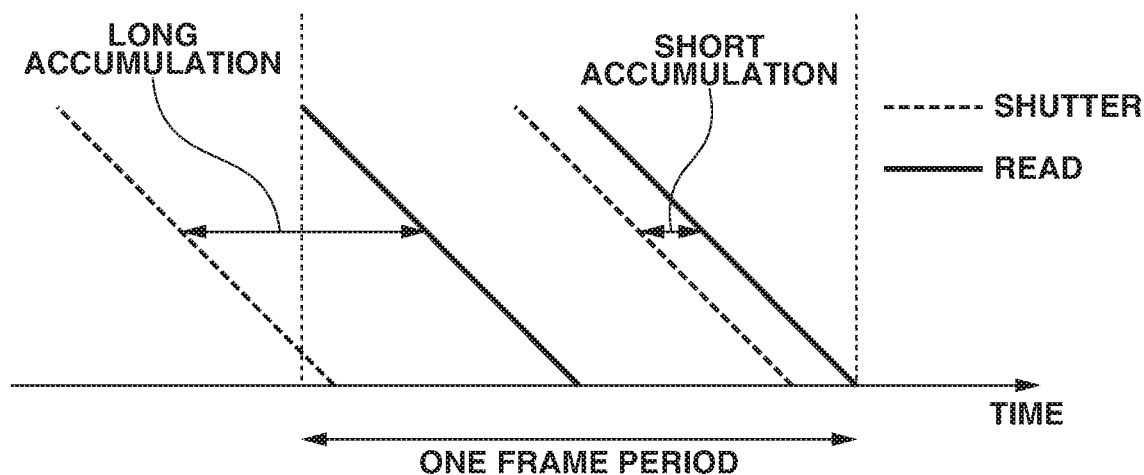
FIG. 6A is a timing chart for describing a third exemplary embodiment.

In a third exemplary embodiment, a case where photoelectric conversion elements 201 have different accumulation periods will be described with reference to FIGS. 6A to 6C. An operation for obtaining an image having an extended dynamic range by combining two images including one for which the accumulation period of the photoelectric conversion elements 201 is set long and one for which the accumulation period is set short will initially be described. FIG. 6A is a timing chart schematically illustrating signal accumulation and read operations. The horizontal axis indicates time. The vertical axis indicates the position of a pixel row.

As illustrated in FIG. 6A, the accumulation and read operations of pixels having a long accumulation period (hereinafter, long accumulation pixels) and the accumulation and read operations of pixels having a short accumulation period (hereinafter, short accumulation pixels) are performed in one frame period. The dotted lines labeled with "shutter" indicate a start of accumulation. Accumulation is sequentially started pixel row by pixel row. The solid lines indicate a start of read operations. Accumulation is sequentially ended and read operations are sequentially performed pixel row by pixel row. When reading the signals of the short accumulation pixels, the column reading circuit unit 105 amplifies the signals with a low gain. When reading the signals of the long accumulation pixels, the column reading circuit unit 105 amplifies the signals with a high gain. In the present exemplary embodiment, in reading the signals of the short accumulation pixels, the read operations are performed while the additional capacitance transistors 206 is turned ON. In other words, operation A illustrated in FIG. 4B or operation D illustrated in FIG. 5B is performed. In reading the signals of the long accumulation pixels, the additional capacitance transistors 206 are turned off. In other words, operation C illustrated in FIG. 4B or operation B' illustrated in FIG. 5B is performed. By performing such two types of read operations, a deterioration in the quality of the image formed based on the signals of the pixels having a long accumulation period can be reduced to enable favorable image combination with a short accumulation image.

Figure 6B:
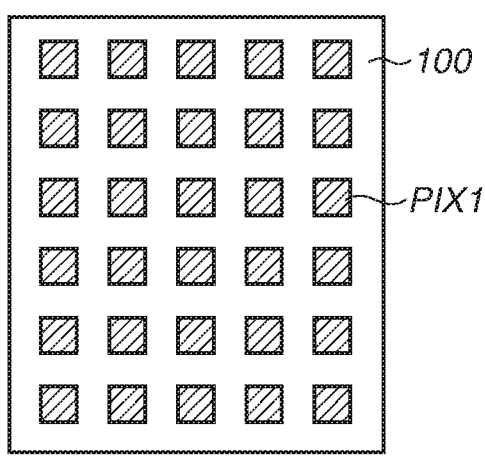
FIGS. 6B and 6C are schematic diagrams for describing the third exemplary embodiment.
Figure 6C:
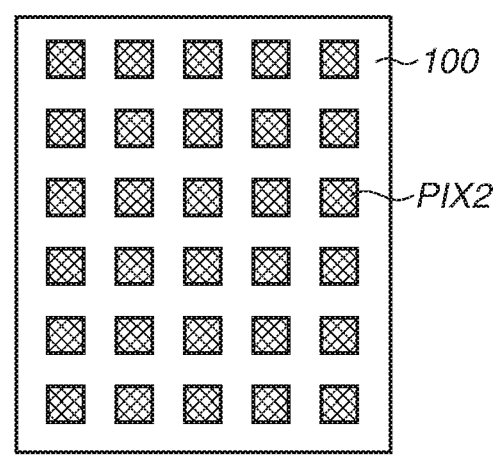

FIGS. 6B and 6C are conceptual diagrams illustrating the pixel area 100 during reading by the two types of reading operations illustrated in FIG. 6A. FIG. 6B illustrates the pixel area 100 in a long accumulation period. FIG. 6C illustrates the pixel area 100 in a short accumulation period. FIG. 6B illustrates pixels PIX1 (oblique stripe pattern) accumulating charges in a predetermined accumulation period. If the read operations of the long accumulation pixels illustrated in FIG. 6A are started, the signals based on the charges are read from the pixels PIX1. FIG. 6C illustrates pixels PIX2 (checker pattern) accumulating charges in an accumulation period shorter than the predetermined accumulation period. If the read operations of the short accumulation pixels illustrated in FIG. 6A are started, the signals based on the charges are read from the pixels PIX2. In other words, a pixel PIX is subjected to a read operation for reading the charge accumulated in the photoelectric conversion element 201 in a short accumulation period and a read operation for reading the charge accumulated in the photoelectric conversion element 201 in a long accumulation period longer than the short accumulation period. In the operations for reading the short accumulation pixels, the control signal Φ206 is set to the L or H level. In the operations for reading the long accumulation pixels, the control signal Φ206 is set to the L or M1 level. Two images based on the signals of the pixels read in such a manner are combined by the signal processing unit outside the photoelectric conversion device, whereby an image of extended dynamic range can be obtained.

Figure 7A:
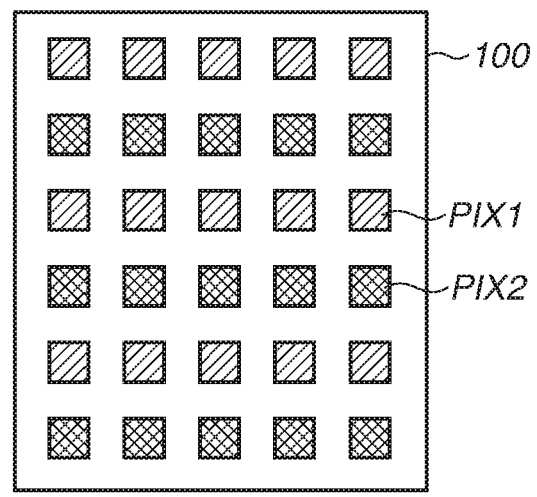
FIGS. 7A and 7B are schematic diagrams for describing the third exemplary embodiment.
Figure 7B:
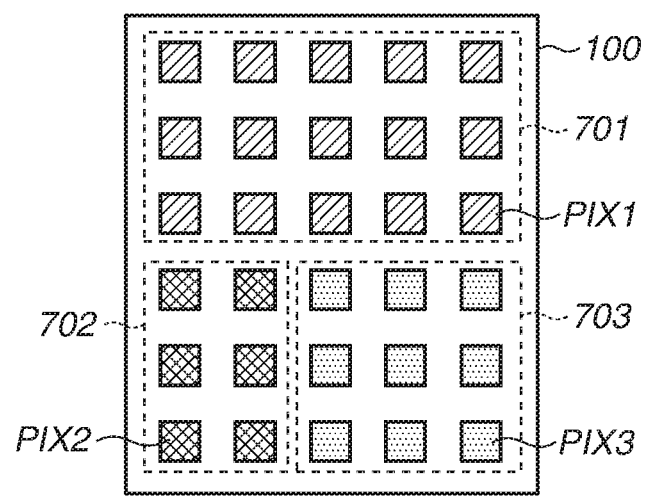

While a method for reading two images has been described with reference to FIGS. 6A to 6C, the method is not restrictive. For example, as illustrated in FIG. 7A, rows of pixels PIX1 having a long accumulation period and rows of pixels PIX2 having a short accumulation period may be alternatively arranged in the pixel area 100. That is, long accumulation pixels PIX1 and short accumulation pixels PIX2 exist at the same time. If the reading of the long accumulation period and the reading of the short accumulation period illustrated in FIG. 6A are performed in an overlapping manner, a half of the pixel area 100 serves as long accumulation pixels PIX1 and the other half as short accumulation pixels PIX2 at a specific time. As illustrated in FIG. 7B, the duration of the accumulation period can be changed not necessarily row by row but by each of areas 701, 702, and 703. The area 701 includes long accumulation pixels PIX1, the area 702 includes short accumulation pixels PIX2, and the area 703 includes long accumulation pixels PIX3 having an accumulation period longer than that of the long accumulation pixels PIX1. Even in such cases, the operations of the additional capacitance transistors 206 and the reset transistors 203 can be selected based on the duration of the accumulation period and the gain of the amplification processing. For example, read operations on the long accumulation pixels PIX1 are performed by operation B or C. Read operations on the short accumulation pixels PIX2 are performed by operation A or D. Read operation on the long accumulation pixels PIX3 are performed by operation B or C. If both the long accumulation pixels PIX1 and PIX3 are read by operation C, appropriate settings can be made, for example, by setting the control signals Φ206 of the long accumulation pixels PIX1 to the M1 level and the control signals Φ206 of the long accumulation pixels PIX3 to the M2 level. If the operations are changed area by area as in FIG. 7B, the photoelectric conversion device can be configured, for example, so that control signals are supplied not only from the vertical scanning circuit unit 103 of FIG. 1 but from the horizontal scanning circuit unit 106 as well.

In the present exemplary embodiment, an example of changing the operations based on the duration of the accumulation period has been described. Modifications may be made as appropriate, for example, to use a method of monitoring luminance information about an object and changing the operations area by area, or a method of monitoring the luminance information about an object, determining an ISO speed, and changing the operations accordingly.

Figure 8:
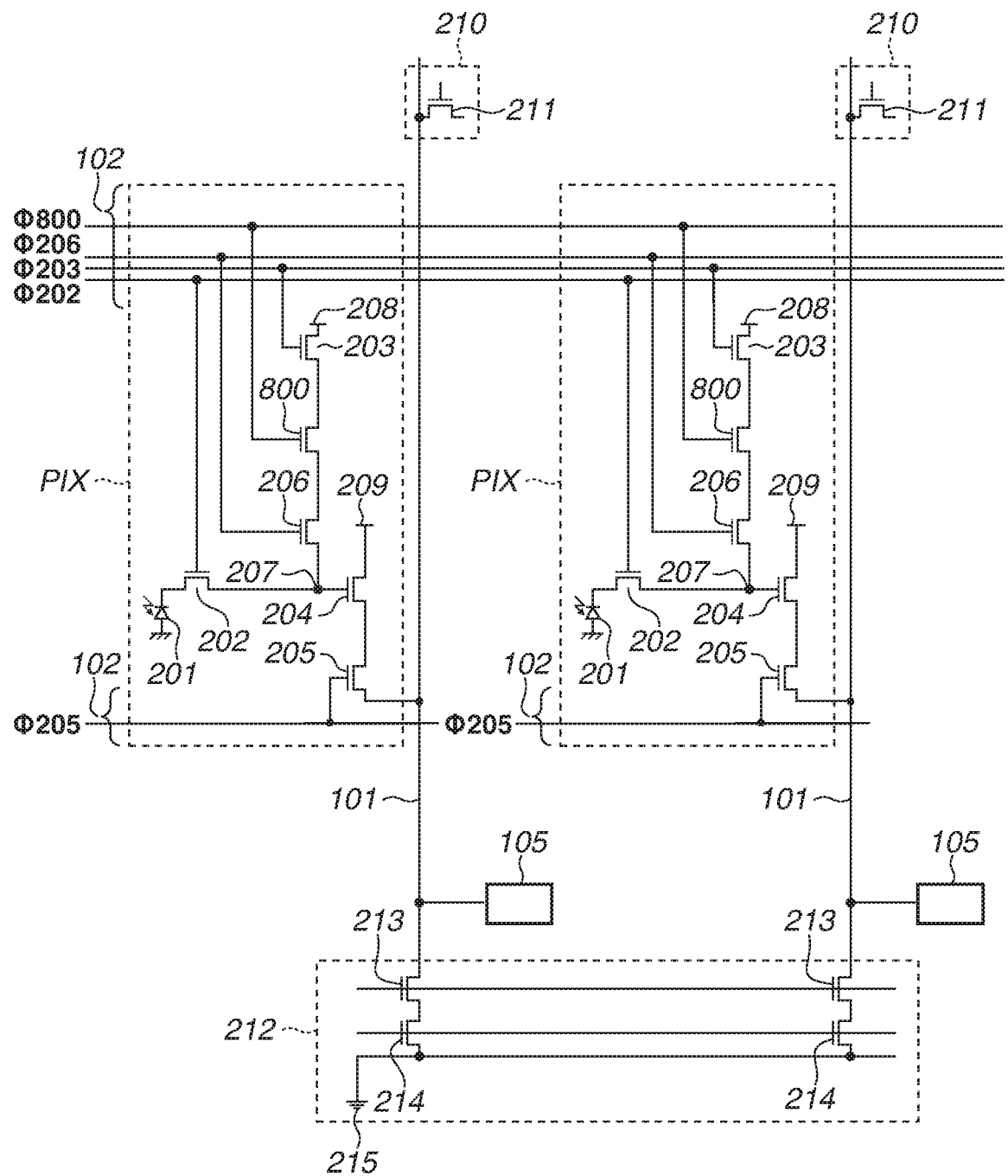
FIG. 8 is a schematic diagram for describing pixel circuits according to a fourth exemplary embodiment.

In a fourth exemplary embodiment, a case where additional capacitance transistors are further included will be described with reference to FIG. 8. FIG. 8 is a schematic circuit diagram related to pixels of a photoelectric conversion device according to the present exemplary embodiment. FIG. 8 is equivalent to FIG. 2 except that additional capacitance transistors 800 are added.

In FIG. 8, an additional capacitance transistor 800 is provided between the additional capacitance transistor 206 and the reset transistor 203. An end of the additional capacitance transistor 800 is connected to an end of the additional capacitance transistor 206. The other end of the additional capacitance transistor 800 is connected to an end of the reset transistor 203. The additional capacitance transistor 800 controls the conduction between the additional capacitance transistor 206 and the reset transistor 203. If the additional capacitance transistors 206 and 800 and the reset transistor 203 are turned on, the power supply voltage 208 is connected to the PD portion 207, whereby the FD portion 207 is reset.

The additional capacitance transistor 800 adds a capacitance to the FD portion 207 in the following manner. If the two additional capacitance transistors 206 and 800 turn on, capacitances related to the additional capacitance transistor 800 are added to the capacitance of the PD portion 207 as well as those related to the additional capacitance transistor 206. Examples of the capacitances related to the additional capacitance transistor 800 include a parasitic capacitance between the gate electrode and the foregoing other end of the additional capacitance transistor 800, and a PN junction capacitance of the semiconductor region constituting the other end. The capacitance of the FD portion 207 can be made even greater than when only the additional capacitance transistor 206 turns on. The dynamic range can thus be further extended. If the additional capacitance transistor 206 turns off, the capacitances related to the two additional capacitance transistors 206 and 800 are not added to the FD portion 207, and the capacitance of the PD portion 207 is unchanged.

A control signal Φ800 supplied to the gate electrode of the additional capacitance transistor 800 has at least three types of voltages. The three types of voltages include an H-level voltage VH at which the additional capacitance transistor 800 turns ON, an L-level voltage VL at which the additional capacitance transistor 800 turns OFF, and an M4-level voltage VM4 that is a voltage between the voltages VH and VL. The voltage VM4 is a voltage for the additional capacitance transistor 800 to operate as an amplitude limiting circuit for the FD portion 207. The voltages VH, VL, and VM4 have a relationship of VH>VM4>VL in magnitude.

Figures 9A, 9B:
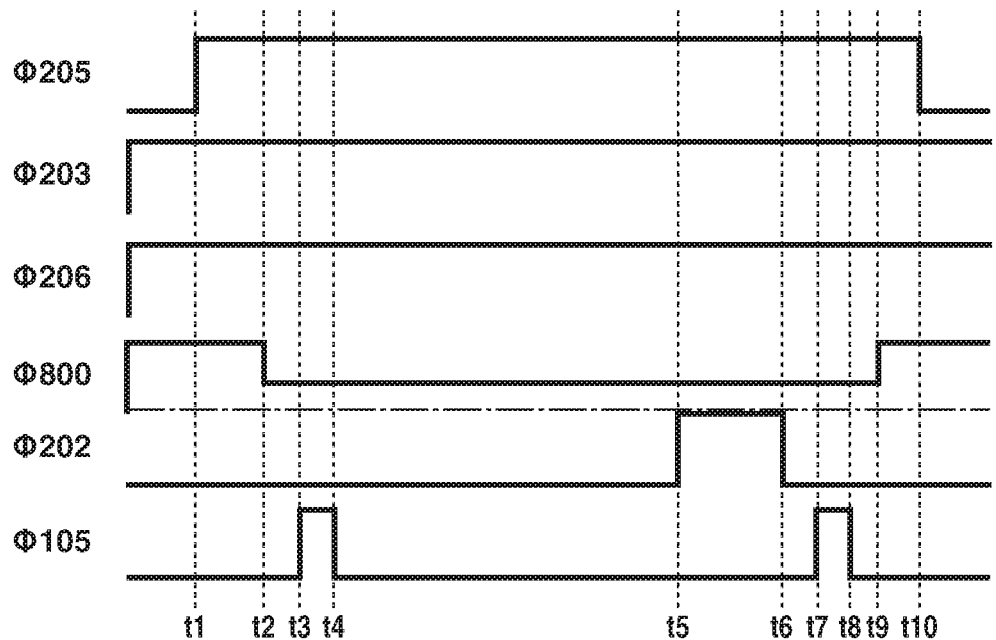
FIG. 9A is a timing chart for describing a fourth exemplary embodiment.
FIG. 9B is a table for describing the fourth exemplary embodiment.

Read operations using the control signal Φ800 will be described with reference to FIG. 9A. FIG. 9A illustrates a case where the additional capacitance transistor 800 is operated as a voltage limiting circuit. FIG. 9A is a timing chart similar to FIG. 4A.

At time t1, the control signal Φ205 becomes the H level. The selection transistor 205 of the pixel PIX turns ON, and the pixel PIX enters a signal-reading state (selected state). The control signals Φ203, Φ206, and Φ800 are at the H level. The two additional capacitance transistors 206 and 800 turn ON, and the reset transistor 203 turns ON. The FD portion 207 and the additional capacitance transistors 206 and 800 in the on state, connected to the FD portion 207, are set (reset) to a predetermined potential by the reset transistor 203.

At time t2, the control signal Φ800 becomes the M4 level. The additional capacitance transistor 800 is thereby turned OFF and starts to function as an amplitude limiting circuit. The reset transistor 203 and the FD portion 207 are disconnected, whereby the resetting of the FD portion 207 is completed. Since the control signals Φ203 and Φ206 are maintained at the high level, the reset transistor 203 and the additional capacitance transistor 206 maintain their ON state. The reset operation can be said to be controlled by the control signal Φ800. Since the additional capacitance transistor 206 is ON, a capacitance is added to the FD portion 207.

At times t3 to t4, the control signal Φ105 becomes the H level, whereby the signal from the pixel PIX is stored into the column reading circuit unit 105 via the vertical signal line 101. The signal is output based on the potential of the PD portion 207 when the FD portion 207 is reset (reset signal). At times t5 to t6, the control signal Φ202 becomes the H level, whereby the charge of the photoelectric conversion element 201 is transferred to the FD portion 207. A signal based on the charge transferred to the FD portion 207 is then output from the pixel PIX. At time t7 to t8, the control signal Φ105 becomes the H level, whereby the signal from the pixel PIX is stored into the column reading circuit unit 105. At time t9, the control signal Φ800 becomes the H level. The additional capacitance transistor 800 thereby turned ON, and the FD portion 207 is reset. At time t10, the control signal Φ205 becomes the L level. This brings the pixel PIX into a non-selected state, and a series of read operations on the pixel PIX is completed.

If a large amount of charge is transferred at times t5 to t6, the additional capacitance transistor 800 operates in such a manner that the potential of the FD portion 207 does not fall excessively. Such an operation can provide a high-quality image signal while increasing the capacitance of the PD portion 207 (capacitance of the input node).

FIG. 9B is a table summarizing the operations like FIGS. 4B and 5B. FIG. 9B illustrates a relationship between the three control signals Φ206, Φ800, and Φ203 in a signal-reading period. The signal-recording period is similar to that of FIG. 4B. A description thereof will thus be omitted.

Like operation B, operation E represents a case where the signal reading operation is performed without adding a capacitance to the FD portion 207. Since the control signal Φ206 is at the voltage VL, no capacitance is added to the FD portion 207. The control signals Φ800 and Φ203 may have any of the voltages. Like operation C, operation F represents a case where the signal reading operation is performed without adding a capacitance to the PD portion 207. Since the control signal Φ206 is at the voltage VM1, the additional capacitance transistor 206 can operate as an amplitude limiting circuit for the FD portion 207. The control signals Φ800 and Φ203 are at the voltage VH, which enables connection between the power supply voltage 208 needed for the amplitude limiting circuit and the additional capacitance transistor 206. In operation G, like operation A, the additional capacitance transistor 206 is turned ON to increase the capacitance of the PD portion 207. Since the control signal Φ800 is at the voltage VL, the capacitances related to the additional capacitance transistor 800 are not added. The control signal Φ203 may have any one of the voltages. Operation H corresponds to the operation of FIG. 9A and represents a case where the signal reading operation is performed with the additional capacitance transistor 206 turned ON to increase the capacitance of the PD portion 207 while the additional capacitance transistor 800 is operated as an amplitude limiting circuit. The control signal Φ203 is at the voltage VH, whereby the power supply voltage 208 and the additional capacitance transistor 800 are connected. Operation I represents a case where the two additional capacitance transistors 206 and 800 are turned ON to maximize the capacitance of the FD portion 207. The control signals Φ206 and Φ800 are at the voltage VH, and the control signal Φ203 is at the voltage VL. In operation J, the capacitance of the PD portion 207 is maximized, and the reset transistor 203 is operated as an amplitude limiting circuit for the FD portion 207. The control signals Φ206 and Φ800 are at the voltage VH, and the control signal Φ203 is at a voltage VM3. A value of the voltage VM3 is between values of the voltages VH and VL. Such an operation can increase the capacitance of the FD portion 207 while suppressing a drop in the potential of the FD portion 207.

In operation K, all the control signals Φ206, Φ800, and Φ203 are at the voltage VH, and the charge of the photoelectric conversion element 201 is discharged. Operation K is used, e.g., for pixels not used for image formation in the pixel area 100. Pixels not used for image formation refer to, for example, ones from which no signal is read and ones from which a signal is read but not used. Examples of such pixels include pixels to be skipped in the signal reading for the purpose of adjusting the number of signals (skipped pixels) and dummy pixels arranged around pixels for outputting a reference signal, such as optical black pixels. For example, to read only the signals of the pixels in the area 702 of FIG. 7B, the following driving can be performed. Set the control signals Φ206, Φ800, and Φ203 of the pixels in the areas 701 and 703 into the state represented by operation K. Set the control signal Φ205 to the L level. Such driving can improve the speed of the read operations since the pixels in the area 701 and 703 are utilized to discharge excessive charges without reading signals.

As described above, a configuration where a plurality of additional capacitance transistors is included in each pixel PIX can also provide a high-quality image.

Figure 10:
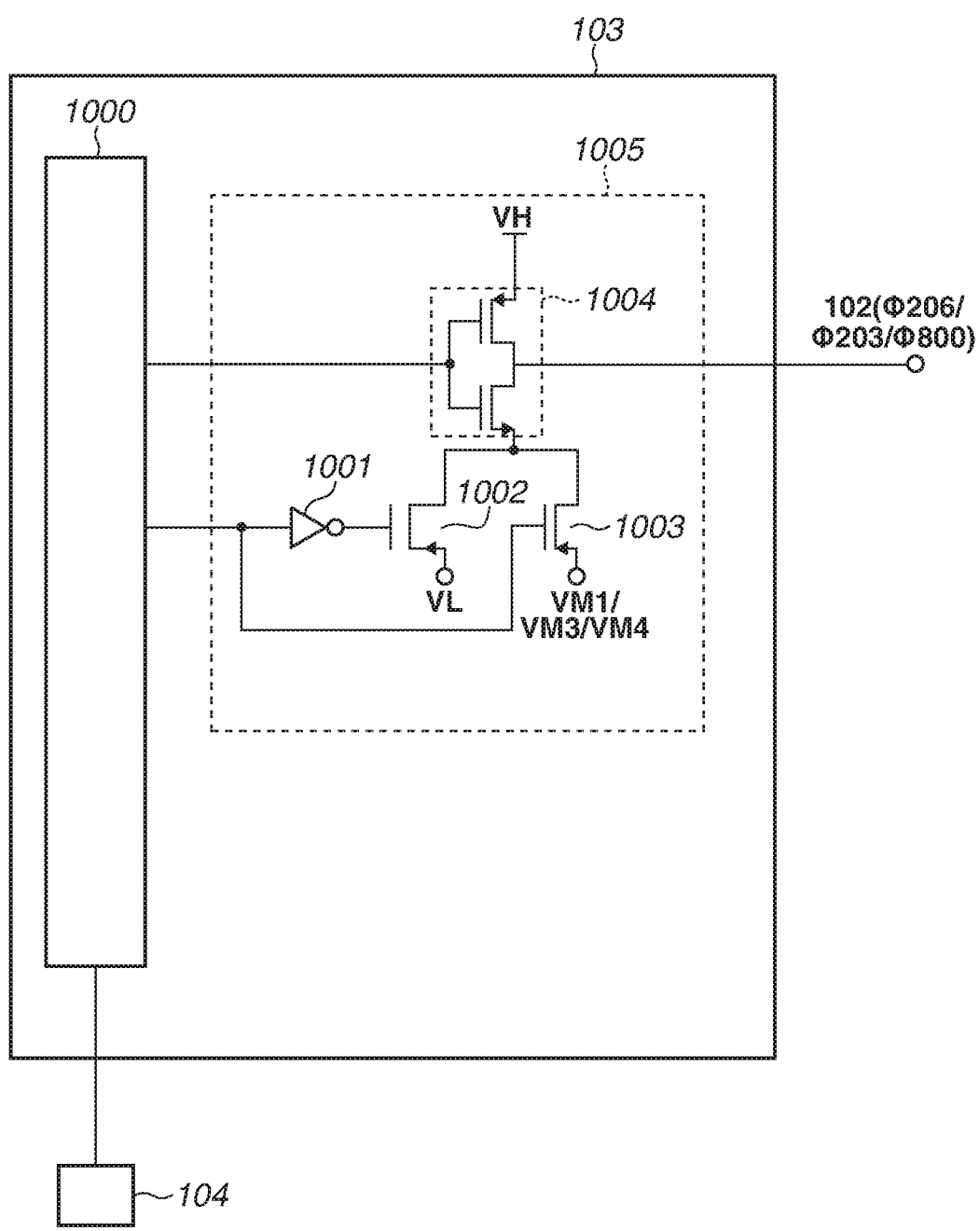
FIG. 10 is a circuit diagram for describing a fifth exemplary embodiment.

In a fifth exemplary embodiment, a configuration of the vertical scanning circuit unit 103 will be described. FIG. 10 is a circuit diagram for describing the vertical scanning circuit unit 103. The vertical scanning circuit unit 103 includes a scanning circuit 1000 and a buffer circuit 1005. The buffer circuit 1005 can receive signals from the scanning circuit 1000 and switch the voltage to be output to a control signal line 102. The buffer circuit 1005 includes two inverters 1001 and 1004 and two transistors 1002 and 1003. An end of the transistor 1002 is connected to the voltage VL. An end of the transistor 1003 is connected to any one of the intermediate voltages VM1, VM3, and VM4. The inverter 1001 is provided to input a signal from the scanning circuit 1000 into the two transistors 1002 and 1003 in a complementary manner. When the transistor 1002 is ON, the transistor 1003 turns OFF and the transistor 1002 outputs the voltage VL. When the transistor 1003 is ON, the transistor 1002 turns OFF and the transistor 1003 outputs any one of the voltages VM1, VM3, and VM4 (hereinafter, referred to as a voltage VM). The inverter 1004 includes a P-type transistor and an N-type transistor. An end of the N-type transistor is connected to the voltage VH. The inverter 1004 outputs any one of the three voltages VH, VL, and VM to the control signal line 102 based on the signal from the scanning circuit 1000. The control signal line 102 illustrated in FIG. 10 is intended to transmit any one of the control signals Φ206, Φ203, and Φ800. The provision of such a buffer circuit 1005 enables supply of a control signal having at least three types of voltages. For example, FIG. 8 illustrates five control signal lines, at least three of which are provided with the buffer circuit 1005 of FIG. 10 each. The operations described in the first to fourth exemplary embodiments can be performed by using such a circuit. To supply a control signal having more than three types of voltages, this circuit can be modified as appropriate. A method for supplying a control having three or more types of voltages is not limited to the circuit of the present exemplary embodiment, and may be implemented as appropriate.

In a sixth exemplary embodiment, operations at times different from those of the operations described in the first to fourth exemplary embodiments will be described. A photoelectric conversion device according to the present exemplary embodiment is similar to that illustrated in FIGS. 1 and 2. FIGS. 11A and 11B are timing charts for describing the present exemplary embodiment. FIG. 11A corresponds to FIG. 4A described in the first exemplary embodiment. A description of operations similar to those of FIG. 4A will be omitted. FIG. 11B corresponds to FIG. 5A described in the second exemplary embodiment. A description of operations similar to those of FIG. 5A will be omitted.

Referring to FIG. 11A, a case where the additional capacitance transistor 206 is operated as an amplitude limiting circuit will initially be described. FIG. 11A illustrates various control signals at times t0 to t12. In the present exemplary embodiment, the operations of times t0 to t12 are repeated. In FIG. 11A, the control signals between times t1 and t10 are the same as those illustrated at times t1 to t10 in FIG. 4A. A description thereof will thus be omitted. In other words, the operations at times t1 to t10 of FIG. 11A are the same as those of FIG. 4A. In FIG. 11A, like FIG. 4A, the control signal Φ206 is at the M1 level and the additional capacitance transistor 206 is operating as an amplitude limiting circuit at times t2 to t9.

In FIG. 11A, times t6 to t12 and times t0 to t5 are the accumulation period of the photoelectric conversion element 201. In the accumulation period, the control signal Φ206 of FIG. 11A becomes the M1 level. Setting the control signal Φ206 to the M1 level in the accumulation period provides the following effects. If the photoelectric conversion element 201 is irradiated with strong light during the accumulation period, the potential of the FD portion 207 can drop due to a charge overflowing from the photoelectric conversion element 201 to the PD portion 207 and a charge occurring in the FD portion 207. A drop in the potential of the PD portion 207 changes the reference signal read at time t3, and the signal read at time t7 is read as a smaller signal than in normal cases. For example, when the photoelectric conversion device is used as an imaging device and if the imaging device captures an image of an object having high luminance such as the Sun, the signal levels of portions irradiated with the strong light can drop to cause a deterioration in image quality, such as darkening at the center of the Sun. On the contrary, in the present exemplary embodiment, the control signal Φ206 is set to the M1 level in the accumulation period, whereby a potential drop of the FD portion 207 can be suppressed. This can suppress a drop in image quality even if there is a strong light source such as the Sun when the photoelectric conversion device is used. Such an effect can be obtained by setting the control signal Φ206 to the M1 level between the H and L levels in at least part of the accumulation period.

Referring to FIG. 11B, a case where the reset transistor 203 is operated as an amplitude limiting circuit will be described. FIG. 11B illustrates various control signals at times t0 to t12. In this case, the operations of times t0 to t12 are repeated. In FIG. 11B, the control signals between times t1 to t10 are the same as those illustrated at times t1 to t10 in FIG. 5A. A description thereof will thus be omitted. In other words, the operations at times t1 to t10 of FIG. 11B are the same as those of FIG. 5A. In FIG. 11B, like FIG. 5A, the control signal Φ203 is at the M2 level at times t2 to t9. The M2 level refers to the voltage VM2, which satisfies the relationship of VH>VM2>VL. Since the control signal Φ206 is at the H level, the reset transistor 203 operates as an amplitude limiting circuit. In FIG. 11B, like FIG. 11A, times t6 to t12 and times t0 to t5 are the accumulation period of the photoelectric conversion element 201. In the accumulation period, the control signal Φ203 of FIG. 11B becomes the M2 level. Since the control signal Φ206 is at the H level and the control signal Φ203 is at the M2 level in the accumulation period, a potential drop of the FD portion 207 can be suppressed as in FIG. 11A.

FIG. 11C is a table summarizing the operations of FIGS. 11A and 11B. At times t0 to t13 and times t11 to t12, the control signals Φ206 and Φ203 can take the following voltages. In operation C" corresponding to FIG. 11A, the control signal Φ206 is at the voltage VM1, and the control signal Φ203 is at the voltage VH. In operation D" corresponding to FIG. 11B, the control signal Φ206 is at the voltage VH, and the control signal Φ203 is at the voltage VM2. At the other times, the operations illustrated in FIGS. 4B and 5B can be selected as appropriate.

In the present exemplary embodiment, operations for suppressing a potential drop of the FD portion 207 in the accumulation period have been described. In the present exemplary embodiment, the operations for suppressing a potential drop of the FD portion 207 during signal transfer, described in the first to fourth exemplary embodiments, are performed as well. However, the operations according to the present exemplary embodiment do not need to be accompanied by the operations described in the first to fourth exemplary embodiments. Specifically, at times t2 to t9 of FIG. 11A, the control signal Φ206 may be set to the L level. Such an operation can also suppress a potential drop of the FD portion 207 in the accumulation period and can suppress a drop in image quality.

Figure 12A:
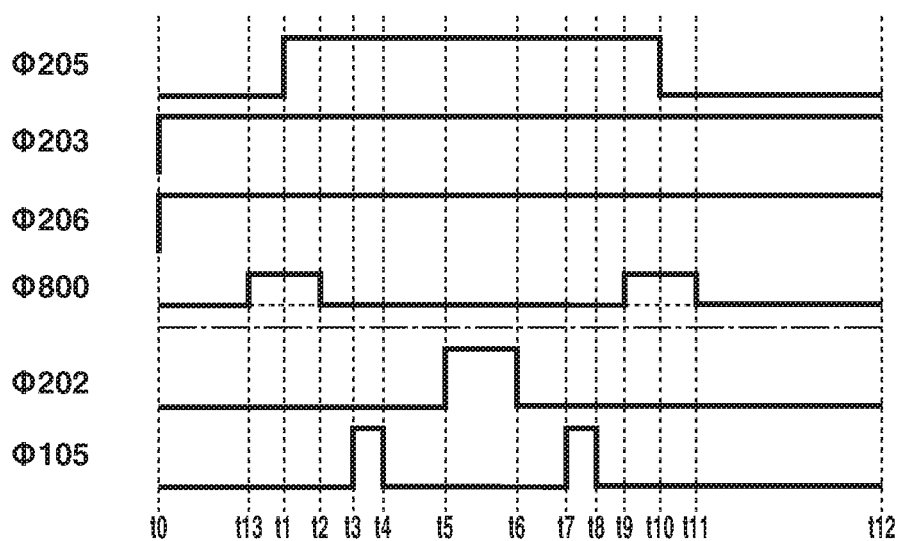
FIGS. 12A, 12B, and 12C are timing charts for describing a seventh exemplary embodiment.
Figure 12B:
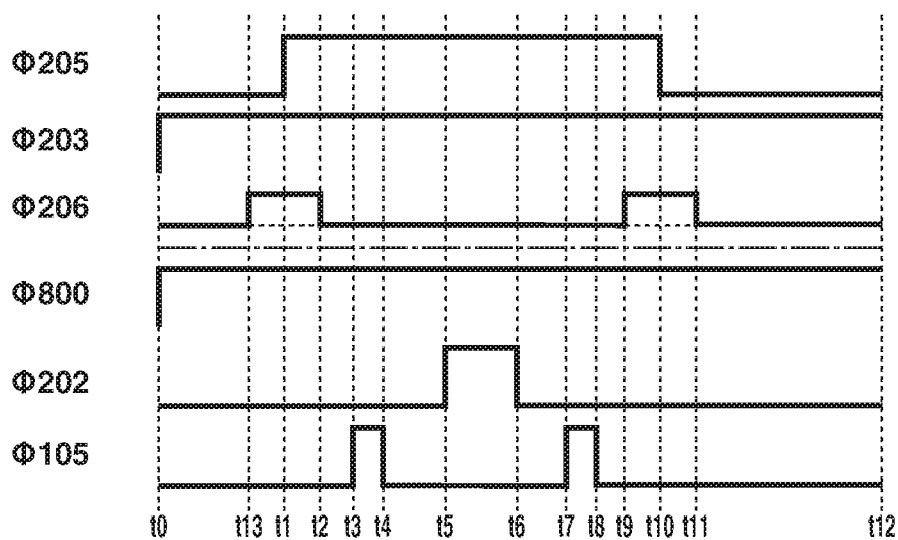
Figure 12C:
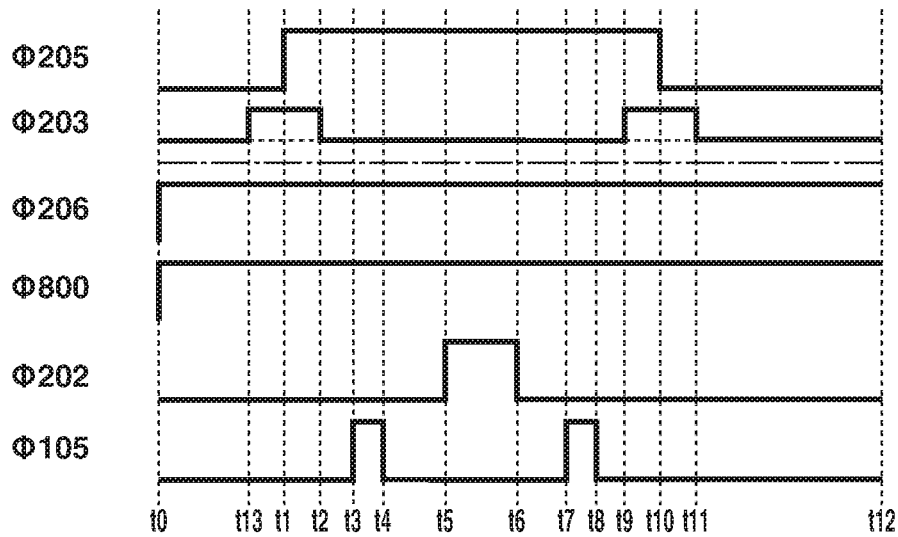

In a seventh exemplary embodiment, a case where the photoelectric conversion device described in the fourth exemplary embodiment performs the operations described in the sixth exemplary embodiment will be described. A photoelectric conversion device according to the present exemplary embodiment includes the circuits illustrated in FIG. 8. FIGS. 12A to 12C are timing charts for describing the present exemplary embodiment.

Referring to FIG. 12A, a case where the additional capacitance transistor 800 is operated as an amplitude limiting circuit will be described. FIG. 12A corresponds to FIG. 9A. A description of operations similar to those of FIG. 9A will be omitted. FIG. 12A illustrates various control signals at times t0 to t12. In the present exemplary embodiment, the operations of times t0 to t12 are repeated. In FIG. 12A, the control signals between times t1 to t10 are the same as those illustrated at times t1 to t10 in FIG. 9A. The operations at times t1 to t10 of FIG. 12A are the same as those of FIG. 9A. In FIG. 12A, like FIG. 9A, the control signal Φ800 is at the M1 level and the additional capacitance transistor 800 is operating as an amplitude limiting circuit at times t2 to t9.

In FIG. 12A, unlike FIG. 9A, the control signal Φ800 at times t0 to t13 and times t11 to t12 is at the M1 level. In FIG. 12A, times t6 to t12 and times t0 to t5 are the accumulation period of the photoelectric conversion element 201. In the accumulation period, the control signal Φ800 of FIG. 12A becomes the M1 level. Since the control signal Φ800 becomes the M1 level in the accumulation period, a potential drop of the FD portion 207 can be suppressed.

FIG. 12B is a timing chart in the case where the additional capacitance transistor 206 is operated as an amplitude limiting circuit. In FIG. 12B, the control signals Φ800 and Φ203 are maintained at the H level. At times t0 to t13 and times t11 to t12, the control signal Φ206 becomes the M1 level. At times t2 to t9, the control signal Φ206 becomes the M1 level. Such operations can suppress a potential drop of the FD portion 207 while increasing the capacitance of the FD portion 207.

FIG. 12C is a timing chart in the case where the reset transistor 203 is operated as an amplitude limiting circuit. In FIG. 12C, the control signals Φ800 and Φ206 are maintained at the H level. At times t0 to t13 and times t11 to t12, the control signal Φ203 becomes the M1 level. At times t2 to t9, the control signal Φ203 becomes the M1 level. Such operations can suppress a potential drop of the PD portion 207 while increasing the capacitance of the FD portion 207 more than in FIG. 12B.

In the present exemplary embodiment, operations for suppressing a potential drop of the FD portion 207 in the accumulation period have been described. In the present exemplary embodiment, the operations for suppressing a potential drop of the FD portion 207 during signal transfer, described in the first to fourth exemplary embodiments, are performed as well. However, such operations do not necessarily need to be performed. Specifically, at times t2 to t9 of FIG. 12A, the control signal Φ800 may be at the L level. At times t2 to t9 of FIG. 12B, the control signal Φ206 may be at the L level. At times t2 to t9 of FIG. 12C, the control signal Φ203 may be at the L level. Even such operations can suppress a potential drop of the FD portion 207 in the accumulation period.

Figure 13A:
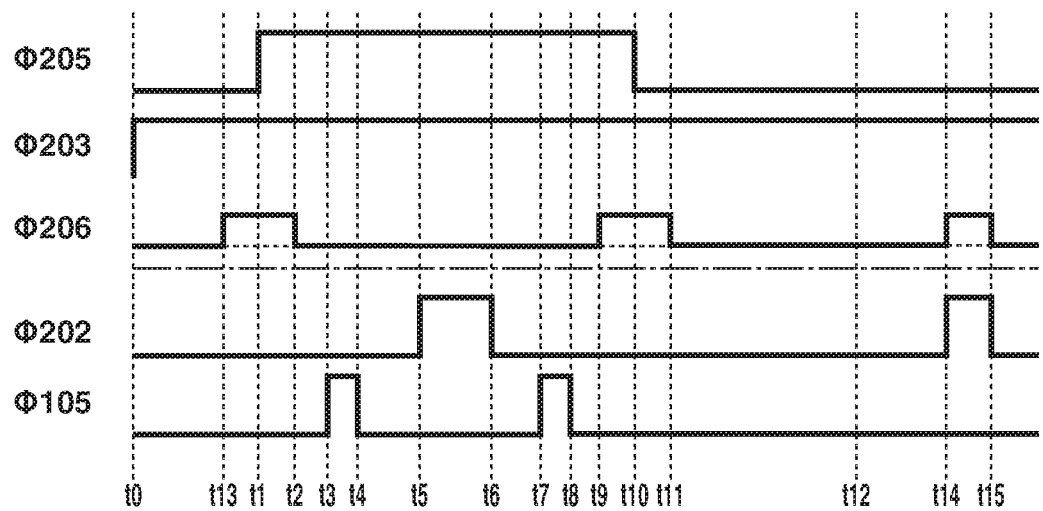
FIGS. 13A and 13B are timing charts for describing an eighth exemplary embodiment.
Figure 13B:
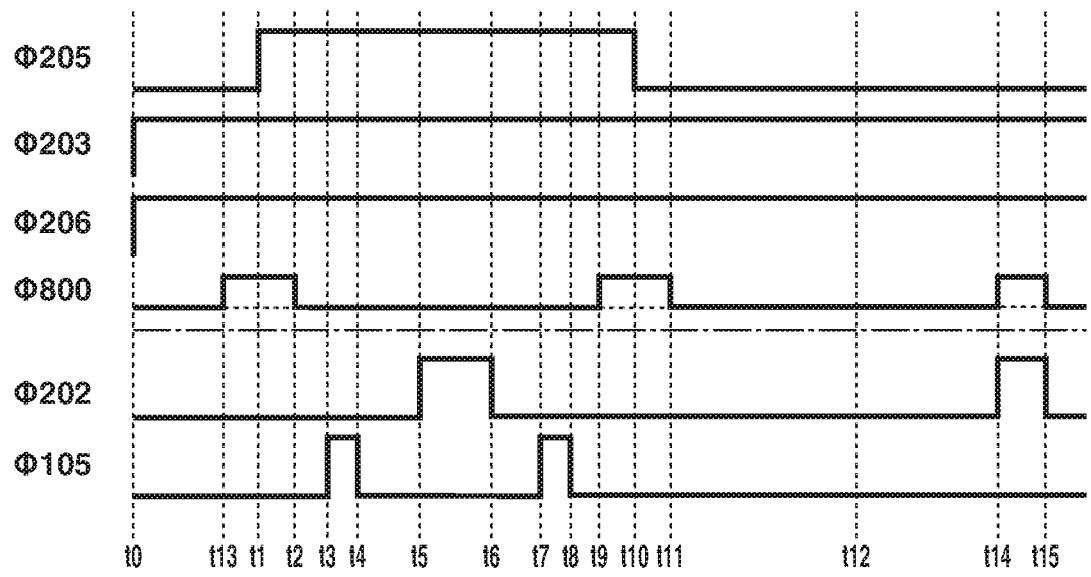

In an eighth exemplary embodiment, a case where the accumulation period of the photoelectric conversion element 201 is determined by timing different from the other exemplary embodiments will be described. FIGS. 13A and 13B are timing charts for describing the present exemplary embodiment. FIG. 13A is a timing chart corresponding to FIG. 11A. FIG. 13B is a timing chart corresponding to FIG. 12A. In FIGS. 13A and 13B, control signals for starting an accumulation period different from FIGS. 11A and 12A are supplied.

At times t14 to t15 of FIG. 13A, the control signals Φ202 and Φ206 become the H level. At times t14 to t15 of FIG. 13B, the control signals Φ202 and Φ800 become the H level. In either case, the photoelectric conversion element 201 and the PD portion 207 are reset. In FIG. 13A, the control signal Φ202 becomes the L level and the control signal Φ206 becomes the M1 level at time t15. In FIG. 13B, the control signal Φ202 becomes the L level and the control signal Φ800 becomes the M1 level at time t15. In both FIGS. 13A and 13B, the time t15 is the accumulation start time of the photoelectric conversion element 201. The accumulation period of the photoelectric conversion element 201 may be determined by such operations. These operations may be combined with the other exemplary embodiments as appropriate. For example, in the cases of FIGS. 12B and 12C, the accumulation start time of the photoelectric conversion element 201 can be defined by controlling the control signal Φ203 or Φ206 instead of the control signal Φ800.

At times t11 to t14, the control signal Φ206 of FIG. 13A and the control signal Φ800 of FIG. 13B are at the M1 level. However, this is not restrictive. Such control signals may be at the H level, the M1 level, or the L level.

In a ninth exemplary embodiment, an example of a photoelectric conversion device will be described. The photoelectric conversion device according to the present exemplary embodiment includes at least two stackable semiconductor substrates that are electrically connected to and stacked on each other. Such a photoelectric conversion device may be referred to as a stacked photoelectric conversion device. As employed herein, the semiconductor substrates may be referred to as members or chips.

Figure 14:
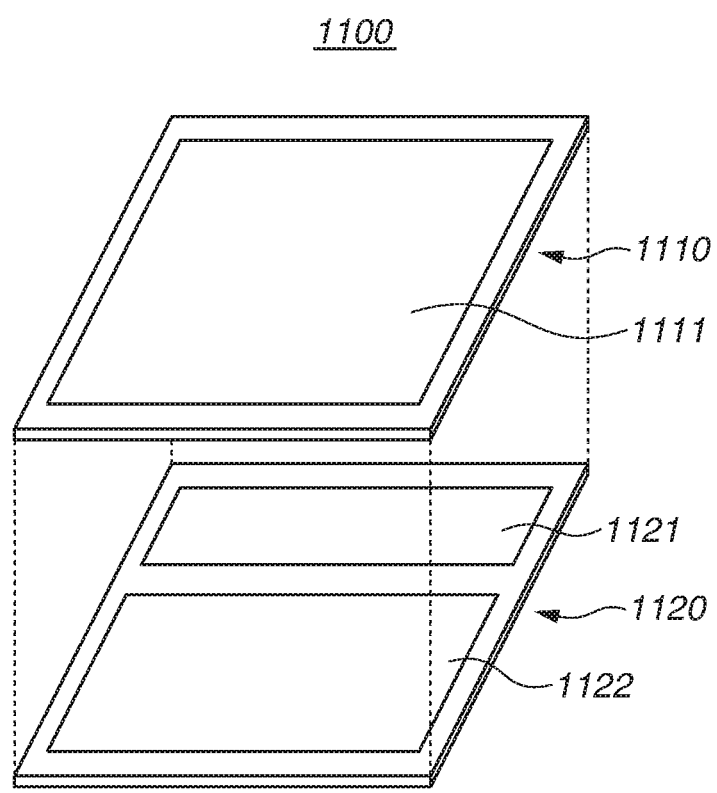
FIG. 14 is a schematic diagram for describing a photoelectric conversion device according to a ninth exemplary embodiment.

FIG. 14 is a schematic diagram illustrating a photoelectric conversion device 1100 according to the present exemplary embodiment. FIG. 14 is an exploded perspective view of the photoelectric conversion device 1100. An semiconductor substrate 1110 includes a pixel area 1111. Another semiconductor substrate 1120 includes a control unit 1121 and a signal processing unit 1122. The orthographic projections of the control unit 1121 and the signal processing unit 1122 upon the semiconductor substrate 1110 both overlap with the pixel area 1111 at least in part. The photoelectric conversion device 1100 according to the present exemplary embodiment may further include a semiconductor substrate including another processing circuit. Three or more stackable semiconductor substrates may be included.

The control unit 1121 can include a vertical scanning circuit for supplying driving signals to pixel circuits, and a power supply circuit. The control unit 1121 can include a timing generation circuit for driving the photoelectric conversion device 1100, a reference signal supply circuit for supplying a reference signal to a conversion circuit, and a horizontal scanning circuit for sequentially reading signals from an amplification circuit or a conversion circuit. For example, the control unit 1121 includes the vertical scanning circuit unit 103, the horizontal scanning circuit unit 106, and the control circuit unit 104 of the photoelectric conversion device illustrated in FIG. 1.

The signal processing unit 1122 processes electrical signals based on signal charges occurring in the pixel area 1111. The signal processing unit 1122 can include a noise reduction circuit, an amplification circuit, a conversion circuit, and an image signal processing circuit. Examples of the noise reduction circuit include a correlated double sampling (CDS) circuit. Examples of the amplification circuit include a column amplifier circuit. Examples of the conversion circuit include an analog-to-digital conversion (ADC) circuit including a comparator and a counter. The image signal processing circuit includes a memory and a processor, for example, and generates image data from an AD-converted digital signal and applies image processing to the image data. For example, the signal processing unit 1122 includes the column reading circuit unit 105 illustrated in FIG. 1.

In the present exemplary embodiment, the buffer circuit 1005 illustrated in FIG. 10 is arranged on the semiconductor substrate 1120. The operations described in the first to fifth exemplary embodiments can be performed if there is a semiconductor substrate on which a scanning circuit unit including the buffer circuit 1005 for supplying a control signal is provided aside from a semiconductor substrate including the pixel area 1111.

Figure 15:
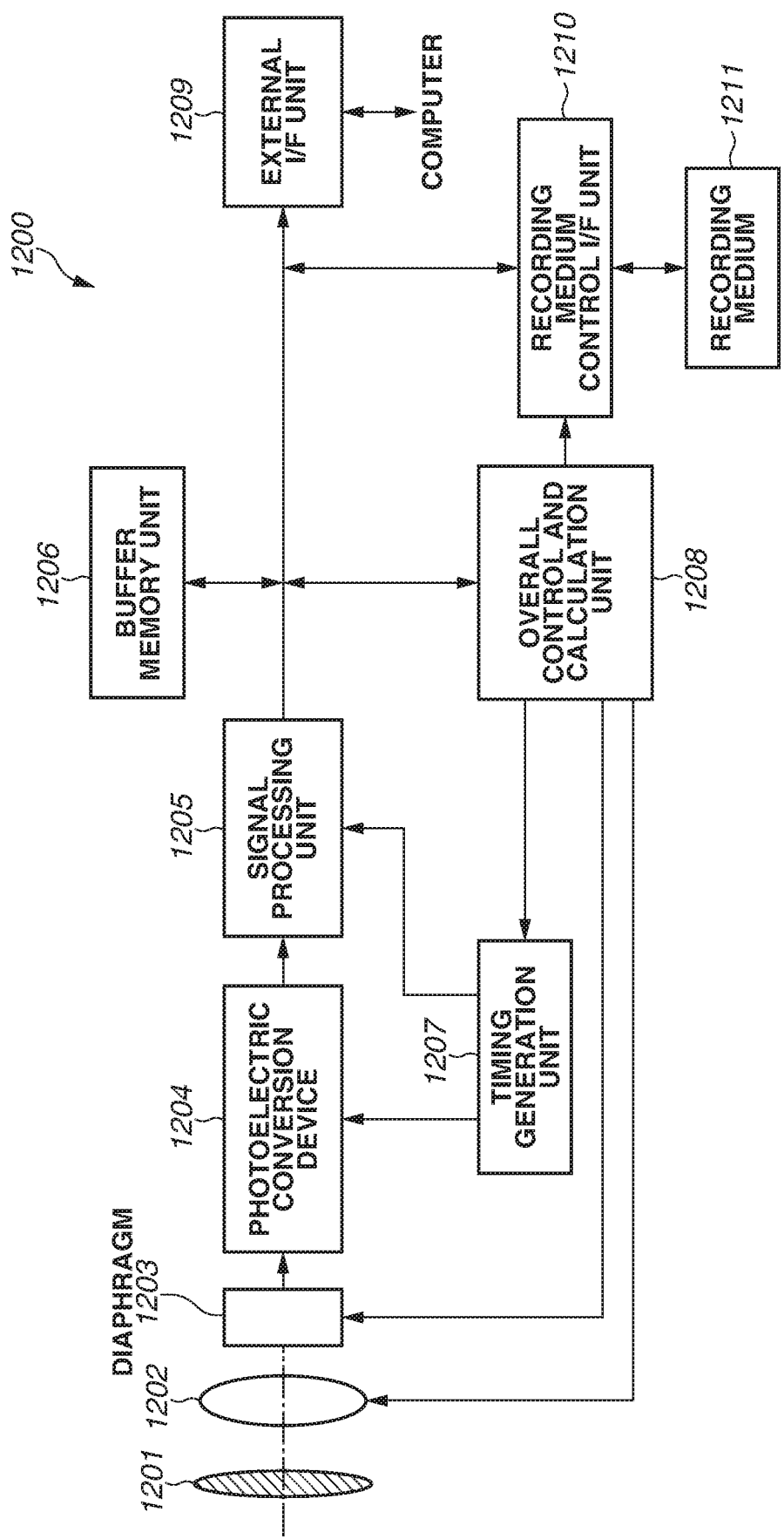
FIG. 15 is a diagram illustrating a configuration of an imaging system.

FIG. 15 is a block diagram illustrating a configuration of an imaging system 1200 according to a tenth exemplary embodiment. The imaging system 1200 according to the present exemplary embodiment includes a photoelectric conversion device 1204. Any one of the photoelectric conversion devices described in the foregoing exemplary embodiments can be applied to the photoelectric conversion device 1204. Specific examples of the imaging system 1200 include a digital still camera, a digital camcorder, and a surveillance camera. FIG. 15 illustrates a digital still camera as an example of the imaging system 1200.

The imaging system 1200 illustrated in FIG. 15 includes a photoelectric conversion device 1204, a lens 1202, a diaphragm 1203, and a barrier 1201. The lens 1202 forms an optical image of an object on the photoelectric conversion device 1204. The diaphragm 1203 can change the amount of light passed through the lens 1202. The barrier 1201 protects the lens 1202. The lens 1202 and the diaphragm 1203 are included in an optical system for focusing light on the photoelectric conversion device 1204.

The imaging system 1200 includes a signal processing unit 1205 that processes an output signal output from the photoelectric conversion device 1204. The signal processing unit 1205 performs signal processing operations for performing various types of correction and compression on the input signal according to need, and outputting the resulting signal. The imaging system 1200 further includes a buffer memory unit 1206 for temporarily storing image data, and an external interface (I/F) unit 1209 for communicating with an external computer. The imaging system 1200 further includes a recording medium 1211 for recording or reading imaging data, such as a semiconductor memory, and a recording medium control I/F unit 1210 for performing recording or reading on the recording medium 1211. The recording medium 1211 may be built in the imaging system 1200 or a removable one. Communication from the recording medium control I/F unit 1210 to the recording medium 1211 and communication from the external I/F unit 1209 may be wirelessly performed.

The imaging system 1200 further includes an overall control and calculation unit 1208 that performs various calculations and controls the entire digital still camera, and a timing generation unit 1207 that outputs various timing signals to the photoelectric conversion device 1204 and the signal processing unit 1205. The timing signals may be input from outside. The imaging system 1200 includes at least the photoelectric conversion device 1204 and the signal processing unit 1205 that processes the output signal output from the photoelectric conversion device 1204. As described in the ninth exemplary embodiment, the timing generation unit 1207 may be implemented on the photoelectric conversion device 1204. The overall control and calculation unit 1208 and the timing generation unit 1207 may be configured to perform part or all of the control functions of the photoelectric conversion device 1204.

The photoelectric conversion device 1204 outputs an image signal to the signal processing unit 1205. The signal processing unit 1205 applies predetermined signal processing to the image signal output from the photoelectric conversion device 1204, and outputs image data. The signal processing unit 1205 also generates an image by using the image signal. The signal processing unit 1205 and the timing generation unit 1207 may be implemented on the photoelectric conversion device 1204. In other words, the signal processing unit 1205 and the timing generation unit 1207 may be arranged on the substrate including the pixels, or on another substrate as described in the ninth exemplary embodiment. An imaging system capable of obtaining high quality images can be constructed by configuring the imaging system 1200 by using any one of the photoelectric conversion devices according to the foregoing exemplary embodiments.

Figure 16A:
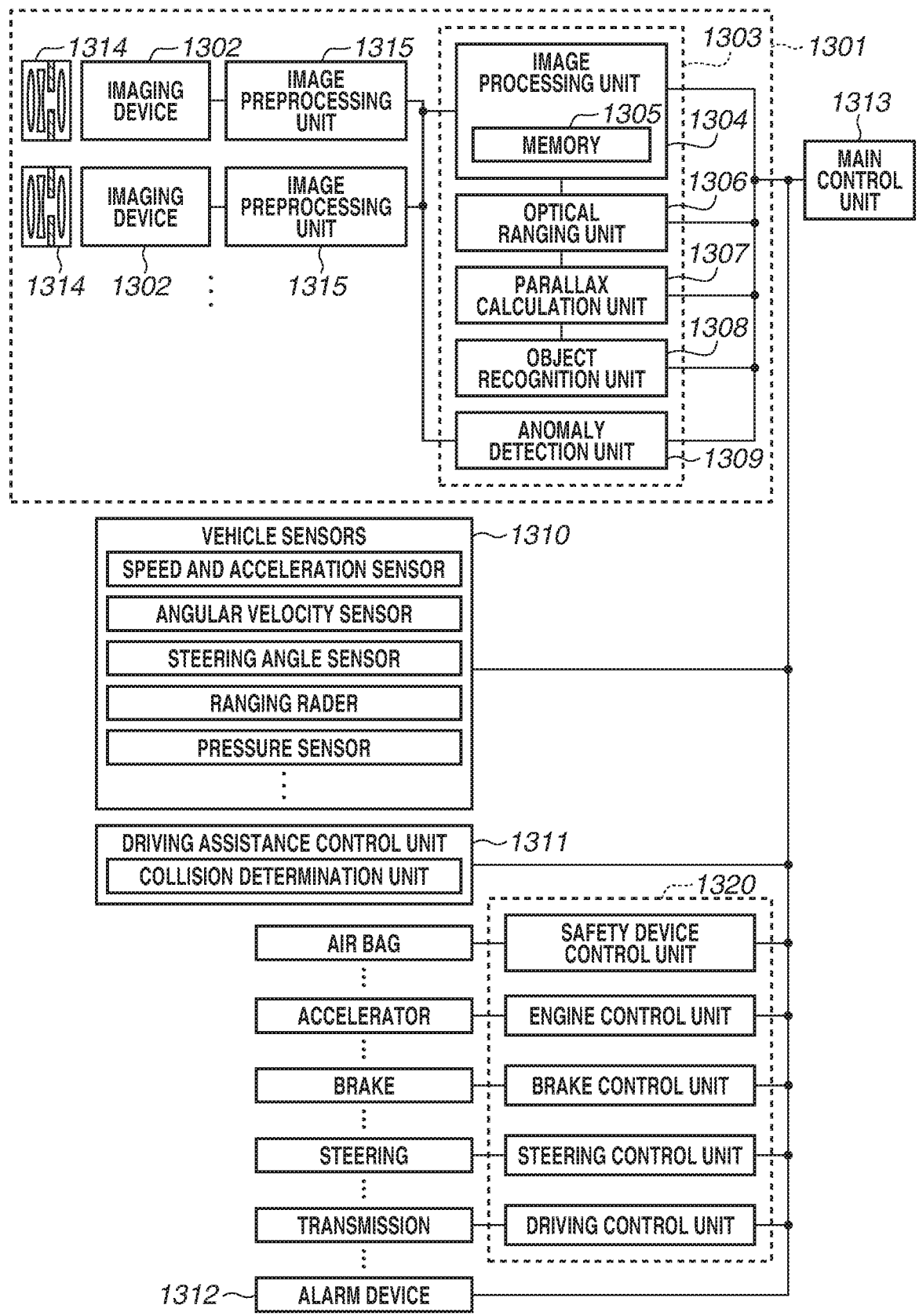
Figure 17:
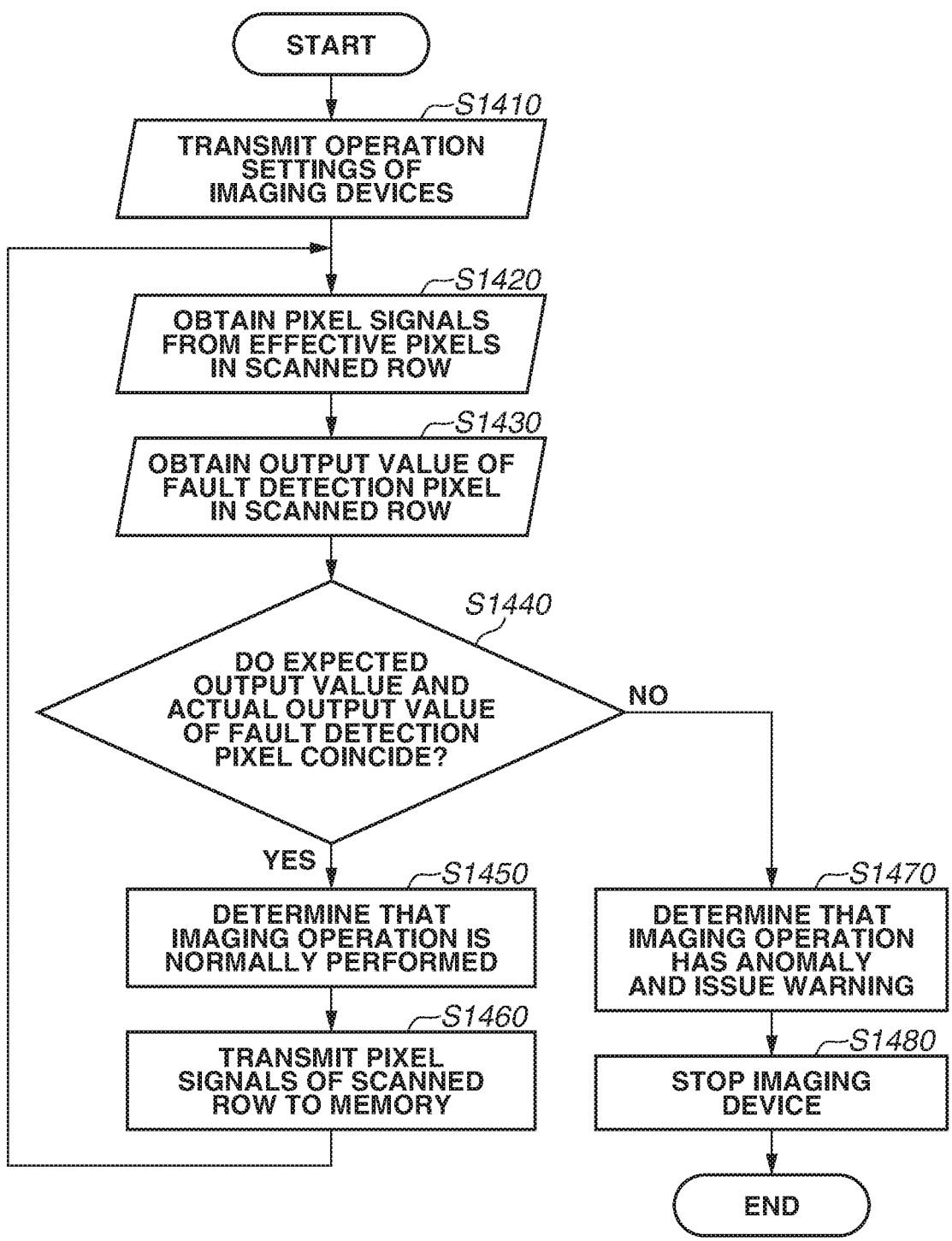
FIG. 17 is a flowchart illustrating an operation flow of the moving body.

An imaging system and a moving body according to an eleventh exemplary embodiment will be described with reference to FIGS. 16A, 16B, and 17. FIGS. 16A and 16B are schematic diagrams illustrating a configuration example of the imaging system and the moving body according to the present exemplary embodiment. FIG. 17 is a flowchart illustrating an operation of the imaging system according to the present exemplary embodiment. In the present exemplary embodiment, a vehicle-mounted camera will be described as an example of the imaging system.

FIGS. 16A and 16B illustrate an example of a vehicle system and an imaging system mounted thereon. An imaging system 1301 includes imaging devices 1302, image preprocessing units 1305, an integrated circuit 1303, and optical systems 1314. The optical systems 1314 form optical images of an object on the imaging devices 1302. The imaging devices 1302 convert the optical images of the object formed by the optical systems 1314 into electrical signals. The imaging devices 1302 are photoelectric conversion devices according to any one of the foregoing exemplary embodiments. The image preprocessing units 1315 perform predetermined signal processing on signals output from the imaging devices 1302. The functions of the image preprocessing units 1315 may be built into the imaging devices 1302. The imaging system 1301 includes at least two sets each including the optical system 1314, the imaging device 1302, and the image preprocessing units 1315. The output from the image preprocessing unit 1315 in each set is input to the integrated circuit 1303.

The integrated circuit 1303 is an integrated circuit intended for imaging system applications, and includes an image processing unit 1304 including a memory 1305, an optical ranging unit 1306, a parallax calculation unit 1307, an object recognition unit 1308, and an anomaly detection unit 1309. The image processing unit 1304 performs image processing such as development processing and defect correction on the output signals of the image preprocessing units 1315. The memory 1305 primarily stores captured images, and stores positions of defective imaging pixels. The optical ranging unit 1306 performs focusing on an object and distance measurement. The parallax calculation unit 1307 calculates parallax information (phase difference between parallax images) from a plurality of pieces of image data obtained by the plurality of imaging devices 1302. The object recognition unit 1308 recognizes objects such as a car, a road, a traffic sign, and a human. If the anomaly detection unit 1309 detects an anomaly of the imaging devices 1302, the anomaly detection unit 1309 warns a main control unit 1313 of the anomaly.

The integrated circuit 1303 may be implemented by dedicatedly-designed pieces of hardware, by software modules, or by a combination of these. A field programmable gate array (FPGA), an application specific integrated circuit (ASIC), or a combination of these may be used for implementation.

The main control unit 1313 governs and controls operation of the imaging system 1301, vehicle sensors 1310, and control units 1320. The imaging system 1301, the vehicle sensors 1310, and the control units 1320 may include respective communication interfaces, and each transmit and receive control signals via a communication network (for example, based on a Controller Area Network (CAN) standard) without the main control unit 1313.

The integrated circuit 1303 has a function of transmitting control signals and setting values to the imaging devices 1302 in response to control signals from the main control unit 1313 or based on its own control unit.

The imaging system 1301 is connected to the vehicle sensors 1310, and can detect the running state of the own vehicle, including a vehicle speed, a yaw rate, and a steering angle, the environment outside the own vehicle, and the states of other vehicles and obstacles. The vehicle sensors 1310 also serve as a distance information acquisition unit for obtaining distance information to an object from parallax images. The imaging system 1301 is also connected to a driving assistance control unit 1311 that provides various driving assistances such as automatic steering, automatic cruising, and a collision prevention function. In particular, as a collision determination function, the driving assistance control unit 1311 estimates and determines the presence or absence of a collision with another vehicle or an obstacle based on the detection results of the imaging system 1301 and the vehicle sensors 1310. If a collision is estimated, avoidance control and collision safety devices are activated.

The imaging system 1301 is also connected to an alarm device 1312 that issues an alarm to the driver based on the determination result of the collision determination unit. For example, if the determination result of the collision determination unit shows a high possibility of collision, the main control unit 1313 performs vehicle control for avoiding the collision or reducing damage by braking, releasing the accelerator, and/or suppressing engine output. The alarm device 1312 warns the user by sounding an alarm, displaying alarm information on a display unit screen of a car navigation system or an instrument panel, and/or vibrating the seatbelt or the steering wheel.

In the present exemplary embodiment, the imaging system 1301 captures images around the vehicle, e.g., in front or behind the vehicle. FIG. 16B illustrates an arrangement example of the imaging system 1301 in the case where the imaging system 1301 captures images in front of the vehicle.

The two imaging devices 1302 are arranged in the front part of a vehicle 1300. Specifically, the two imaging devices 1302 are symmetrically arranged with a centerline in the forward-backward direction or one with respect to the outer shape (for example, vehicle width) of the vehicle 1300 as the axis of symmetry. Such an arrangement is desirable in obtaining distance information between the vehicle 1300 and an object to be imaged and determining the possibility of collision. The imaging devices 1302 may be arranged to not interfere with the field of view of the driver who observes the conditions outside the vehicle 1300 from the driver's seat. The alarm device 1321 may be arranged to be likely to come into the field of view of the driver.

Next, a fault detection operation of each imaging device 1302 in the imaging system 1301 will be described with reference to FIG. 17. The fault detection operation of the imaging device 1302 is performed based on steps S1410 to S1480 illustrated in FIG. 17.

In step S1410, settings upon startup of the imaging device 1302 are made. Specifically, operation settings of the imaging device 1302 are transmitted from outside the imaging system 1301 (for example, the main control unit 1313) or from inside the imaging system 1301. The imaging device 1302 starts an imaging operation and a fault detection operation.

In step S1420, pixel signals is obtained from effective pixels in a scanned row. In step S1430, the output value of a fault detection pixel provided for fault detection purposes in the scanned row is obtained. Like the effective pixels, the fault detection pixel includes a photoelectric conversion unit. A predetermined voltage is written to the photoelectric conversion unit. The fault detection pixel outputs a signal corresponding to the voltage written to the photoelectric conversion unit. Steps S1420 and S1430 may be performed in reverse order.

In step S1440, determination of whether an expected output value of the fault detection pixel and the actual output value of the fault detection pixel coincide is performed. If the expected output value and the actual output value are determined to coincide (YES in step S1440), the processing proceeds to step S1450. In step S1450, it is determined that the imaging operation is normally performed. The processing proceeds to step S1460. In step S1460, the imaging device 1302 transmits the pixel signals of the scanned row into the memory 1305 for primary storage. The processing then returns to step S1420. In step S1420, the fault detection operation is continued on the next row. If, in step S1440, the expected output value and the actual output value are determined to not coincide (NO in step S1440), the processing proceeds to step S1470. In step S1470, it is determined that the imaging operation has an anomaly, and issues a warning to the main control unit 1313 or the alarm device 1312. The alarm device 1312 displays on a display unit that an anomaly is detected. In step S1480, the operation of the imaging device 1302 is stopped, and ends the operation of the imaging system 1301.

In the present exemplary embodiment, the flowchart is described to loop row by row. However, the flowchart may loop in units of a plurality of rows. The fault detection operation may be performed frame by frame. The warning of step S1470 may be issued to outside the vehicle 1300 via a wireless network.

In the present exemplary embodiment, control for avoiding a collision with another vehicle has been described. However, the imaging system 1301 is also applicable to controls such as performing automatic driving to follow another vehicle and performing automatic driving to not go out of the lane. The imaging system 1301 is not limited to a vehicle such as an automobile, and can be applied to a moving body (moving apparatus) such as a ship, an aircraft, and an industrial robot. The imaging system 1301 is not even limited to a moving body, and can be widely applied to apparatuses that use object recognition. Examples include an intelligent transportation system (ITS).

The exemplary embodiments have dealt with situations where the FD portion 207 of a pixel in a specific part of the pixel area drops excessively in potential if strong light is incident on the part. The excessive drop in the potential of the FD portion 207 can cause a deterioration in image quality. For example, if the potential of the FD portion 207 drops excessively, the potential output from the pixel can depart from the operation voltage range of the vertical signal line 101. For example, if the potential of the FD portion 207 drops excessively, the reference potential output from the pixel can also vary. According to the configurations of the exemplary embodiments, an excessive drop in the potential of the FD portion 207 can be suppressed. A deterioration in image quality can thus be suppressed while extending the dynamic range.

A photoelectric conversion device according to an exemplary embodiment may be configured to further include color filters and/or microlenses, and may be configured to be capable of obtaining various types of information such as distance information. For example, the photoelectric conversion device may include a plurality of photoelectric conversion elements 201 for each input node. A common microlens may be provided for the plurality of photoelectric conversion elements 201. While the amplification transistor 204 constitutes part of a source-follower circuit, the amplification transistor 204 may constitute part of an AD converter. Specifically, the amplification transistor 204 may constitute part of a comparator included in the AD converter. Part of the configuration of the comparator may be provided on another semiconductor substrate.

The unit circuits may be configured in such a manner that the photoelectric conversion elements 201 are directly connected to the input nodes without the transfer transistors 202. A charge discharging unit such as an overflow drain may be further provided.

In the exemplary embodiments, all the transistors are described to have an H-level voltage VH and an L-level voltage VL. However, the control signals of the transistors may have voltages VH and VL of respective different values. In other words, the voltages VH and VL of the control signals at which the transistors turn ON and OFF can be freely set.

The disclosure is not limited to the foregoing exemplary embodiments, and various modifications may be made thereto. For example, part of the configuration of any one of the exemplary embodiments may be added to another exemplary embodiment. Part of the configuration of any one of the exemplary embodiments may be replaced with part of the configuration of another exemplary embodiment. Such examples also constitute exemplary embodiments of the disclosure. All the foregoing exemplary embodiments are merely examples of embodiment for carrying out the disclosure, and the technical scope of the disclosure should not be interpreted as limited to such examples. The disclosure can be carried out in various modes without departing from the technical concept or main features thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2018-163772, filed Aug. 31, 2018, and No. 2019-111594, filed Jun. 14, 2019, which are hereby incorporated by reference herein in their entirety.

What is claimed is:

1. A photoelectric conversion device comprising a plurality of unit circuits each including:
   a photoelectric conversion element;
   an output transistor including an input node and configured to output a signal based on a charge from the photoelectric conversion element;
   a reset transistor configured to set a potential of the input node to a predetermined potential; and
   a first transistor connected to the input node and configured to change a capacitance of the input node,
   wherein a first control signal supplied to a gate electrode of the first transistor has at least a first voltage at which the first transistor turns ON, a second voltage at which the first transistor turns OFF, and a third voltage having a value between values of the first and second voltages.

2. The photoelectric conversion device according to claim 1, wherein the first transistor is connected between the input node and the reset transistor.

3. The photoelectric conversion device according to claim 1, further comprising a transfer transistor configured to transfer the charge of the photoelectric conversion element to the input node.

4. The photoelectric conversion device according to claim 1, configured to perform at least one of:
   a first operation in which the first control signal is at the first voltage and the input node has a first capacitance in reading the charge of the photoelectric conversion element;
   a second operation in which the first control signal is at the second voltage and the input node has a second capacitance smaller than the first capacitance in reading the charge of the photoelectric conversion element; and
   a third operation in which the first control signal is at the third voltage and the first transistor limits a variation in the potential of the first input node in reading the charge of the photoelectric conversion element.

5. The photoelectric conversion device according to claim 1, wherein the first control signal has a fourth voltage having a value between values of the third and first voltages.

6. The photoelectric conversion device according to claim 1, further comprising:
   an amplification unit configured to amplify the signal output from each unit circuit,
   wherein, in reading the charge of the photoelectric conversion element, a gain of the amplification unit in a case where the first control signal is at the second voltage is different from a gain of the amplification unit in a case where the first control signal is at the third voltage.

7. The photoelectric conversion device according to claim 1, further comprising:
a signal line to which the signal of each unit circuit is output; and
a clipping circuit configured to limit an amplitude of the signal on the signal line, the clipping circuit including a transistor connected at an end to the signal line,
wherein the amplitude of the signal line to be limited by the clipping circuit is greater than an amplitude of the input node to be limited by the first transistor.

8. The photoelectric conversion device according to claim 1, wherein a second control signal supplied to a gate electrode of the reset transistor has at least a fifth voltage at which the reset transistor turns ON, a sixth voltage at which the reset transistor turns OFF, and a seventh voltage having a value between values of the fifth and sixth voltages.

9. The photoelectric conversion device according to claim 8, configured to further perform a fourth operation in which the first control signal is at the first voltage and the second control signal is at the seventh voltage in reading the charge of the photoelectric conversion element.

10. The photoelectric conversion device according to claim 1, further comprising a second transistor configured to control conduction between the first transistor and the reset transistor, and switch the capacitance of the input node,
wherein a third control signal supplied to a gate electrode of the second transistor has at least an eighth voltage at which the second transistor turns ON, a ninth voltage at which the second transistor turns OFF, and a tenth voltage having a value between values of the eighth and ninth voltages.

11. The photoelectric conversion device according to claim 10, configured to selectively perform:
a first operation in which the first control signal is at the first voltage, the third control signal is at the ninth voltage, and the input node has a first capacitance in reading the charge of the photoelectric conversion element;
a second operation in which the first control signal is at the second voltage and the input node has a second capacitance smaller than the first capacitance in reading the charge of the photoelectric conversion element;
a third operation in which the first control signal is at the third voltage, the third control signal is at the eighth voltage, and the first transistor limits a variation in the potential of the input node in reading the charge of the photoelectric conversion element;
a fifth operation in which the first control signal is at the first voltage, the third control signal is at the eighth voltage, and the input node has a third capacitance greater than the first capacitance in reading the charge of the photoelectric conversion element; and
a sixth operation in which the first control signal is at the first voltage, the third control signal is at the tenth voltage, and the second transistor limits the variation in the potential of the input node in reading the charge of the photoelectric conversion element.

12. The photoelectric conversion device according to claim 11,
wherein a second control signal supplied to a gate electrode of the reset transistor has at least a fifth voltage at which the reset transistor turns ON, a sixth voltage at which the reset transistor turns OFF, and a seventh voltage having a value between values of the fifth and sixth voltages, and
wherein the photoelectric conversion device is configured to perform a seventh operation in which the first control signal is at the first voltage, the second control signal is at the seventh voltage, and the third control signal is at the eighth voltage in reading the charge of the photoelectric conversion element.

13. The photoelectric conversion device according to claim 1, configured to perform an eighth operation in which the first control signal is at the third voltage and the first transistor limits a variation in the potential of the input node in accumulating the charge of the photoelectric conversion element.

14. The photoelectric conversion device according to claim 1,
wherein the first control signal has an eleventh voltage having a value between values of the first and third voltages, and
wherein the photoelectric conversion device is configured to perform a ninth operation in which the first control signal is at the eleventh voltage and the first transistor limits a variation in the potential of the input node in accumulating the charge of the photoelectric conversion element.

15. An imaging system comprising:
the photoelectric conversion device according to claim 1; and
a signal processing unit configured to process a signal output from the photoelectric conversion device.

16. A moving body comprising:
the photoelectric conversion device according to claim 1;
a distance information acquisition unit configured to obtain distance information to an object using parallax information based on a signal from the photoelectric conversion device; and
a control unit configured to control the moving body based on the distance information.

17. A photoelectric conversion device comprising a plurality of unit circuits each including:
a photoelectric conversion element;
an output transistor including an input node and configured to output a signal based on a charge from the photoelectric conversion element;
a reset transistor configured to set a potential of the input node to a predetermined node; and
a first transistor connected to the input node and configured to change a capacitance of the input node,
wherein a control signal supplied to a gate electrode of the reset transistor has at least a voltage at which the reset transistor turns ON and a voltage at which the reset transistor turns OFF,
wherein a control signal supplied to a gate electrode of the first transistor has at least a voltage at which the first transistor turns ON and a voltage at which the first transistor turns OFF, and
wherein the voltage at which the reset transistor turns OFF is different from the voltage at which the first transistor turns OFF.

18. The photoelectric conversion device according to claim 17, wherein the first transistor is connected between the input node and the reset transistor.

19. An imaging system comprising:
the photoelectric conversion device according to claim 17; and a signal processing unit configured to process a signal output from the photoelectric conversion device.

20. A stackable semiconductor device including a scanning circuit configured to supply a control signal to a member including a plurality of unit circuits each including a photoelectric conversion element, an output transistor including an input node and configured to output a signal based on a charge from the photoelectric conversion element, a reset transistor configured to set a potential of the input node to a predetermined node, and a first transistor connected to the input node,
- wherein the scanning circuit is configured to output a control signal supplied to a gate electrode of the first transistor, and
- wherein the control signal to be supplied to the gate electrode of the first transistor has at least a first voltage at which the first transistor turns ON, a second voltage at which the first transistor turns OFF, and a third voltage having a value between those of the first and second voltages.

* * * * *